US012660293B2

(12) United States Patent
Lin et al.

(10) Patent No.: US 12,660,293 B2
(45) Date of Patent: Jun. 16, 2026

(54) INSERTING INHIBITION LAYER FOR INDUCING ANTIFERROELECTRICITY TO FERROELECTRIC STRUCTURE

(71) Applicant: Taiwan Semiconductor Manufacturing Company, Ltd., Hsinchu (TW)

(72) Inventors: Po-Ting Lin, Taichung City (TW); Yu-Ming Hsiang, New Taipei City (TW); Wei-Chih Wen, Hsinchu County (TW); Yin-Hao Wu, Taichung City (TW); Wu-Wei Tsai, Taoyuan City (TW); Hai-Ching Chen, Hsinchu City (TW); Yu-Ming Lin, Hsinchu City (TW); Chung-Te Lin, Tainan City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 602 days.

(21) Appl. No.: 18/150,259

(22) Filed: Jan. 5, 2023

(65) Prior Publication Data

US 2024/0145571 A1     May 2, 2024

Related U.S. Application Data

(60) Provisional application No. 63/420,131, filed on Oct. 28, 2022.

(51) Int. Cl.
H10D 64/68      (2025.01)
H10B 51/30      (2023.01)
(Continued)

(52) U.S. Cl.
CPC ........... H10D 64/689 (2025.01); H10B 51/30 (2023.02); H10D 30/701 (2025.01); H10D 99/00 (2025.01);
(Continued)

(58) Field of Classification Search
CPC .... H10D 64/689; H10D 99/00; H10D 30/701; H10B 51/30; H01L 21/02178;
(Continued)

(56) References Cited

U.S. PATENT DOCUMENTS

2017/0256552 A1     9/2017   Schroeder et al.
2018/0240804 A1     8/2018   Yoo
(Continued)

OTHER PUBLICATIONS

Abdulazhanov et al. "Influence of antiferroelectric-like behavior on tuning properties of ferroelectric HZO-based varactors" MRS Advances (2021) 6:530-534, published on Jul. 23, 2021.

*Primary Examiner* — Richard A Booth
(74) *Attorney, Agent, or Firm* — Eschweiler & Potashnik, LLC

(57)     ABSTRACT

In some embodiments, the present disclosure relates to an integrated circuit (IC) in which a memory structure comprises an inhibition layer inserted between two ferroelectric layers to create a tetragonal-phase dominant ferroelectric structure. In some embodiments, the ferroelectric structure includes a first ferroelectric layer, a second ferroelectric layer overlying the first ferroelectric layer, and a first inhibition layer disposed between the first and second ferroelectric layers and bordering the second ferroelectric layer. The first inhibition layer is a different material than the first and second ferroelectric layers.

20 Claims, 20 Drawing Sheets

(51) Int. Cl.

| | |
|---|---|
| *H10D 30/69* | (2025.01) |
| *H10D 99/00* | (2025.01) |
| *H10P 14/60* | (2026.01) |
| *H10P 14/692* | (2026.01) |

(52) U.S. Cl.
CPC .... *H10P 14/6339* (2026.01); *H10P 14/69391* (2026.01); *H10P 14/69397* (2026.01)

(58) Field of Classification Search
CPC ........... H01L 21/02194; H01L 21/0228; H10P 14/69391; H10P 14/6339
See application file for complete search history.

(56) References Cited

U.S. PATENT DOCUMENTS

| | | | |
|---|---|---|---|
| 2019/0148390 A1 | 5/2019 | Frank | |
| 2021/0359082 A1 | 11/2021 | Kang | |
| 2022/0271046 A1 | 8/2022 | Huang et al. | |
| 2022/0282367 A1 | 9/2022 | Macdonald et al. | |
| 2022/0301785 A1 | 9/2022 | Chen et al. | |
| 2023/0200078 A1* | 6/2023 | Popovici ................ | H10B 51/00 |
| | | | 257/295 |
| 2025/0142936 A1* | 5/2025 | Lee ........................ | H10B 53/00 |
| 2025/0203890 A1* | 6/2025 | Zhang ................... | H10D 1/684 |

* cited by examiner

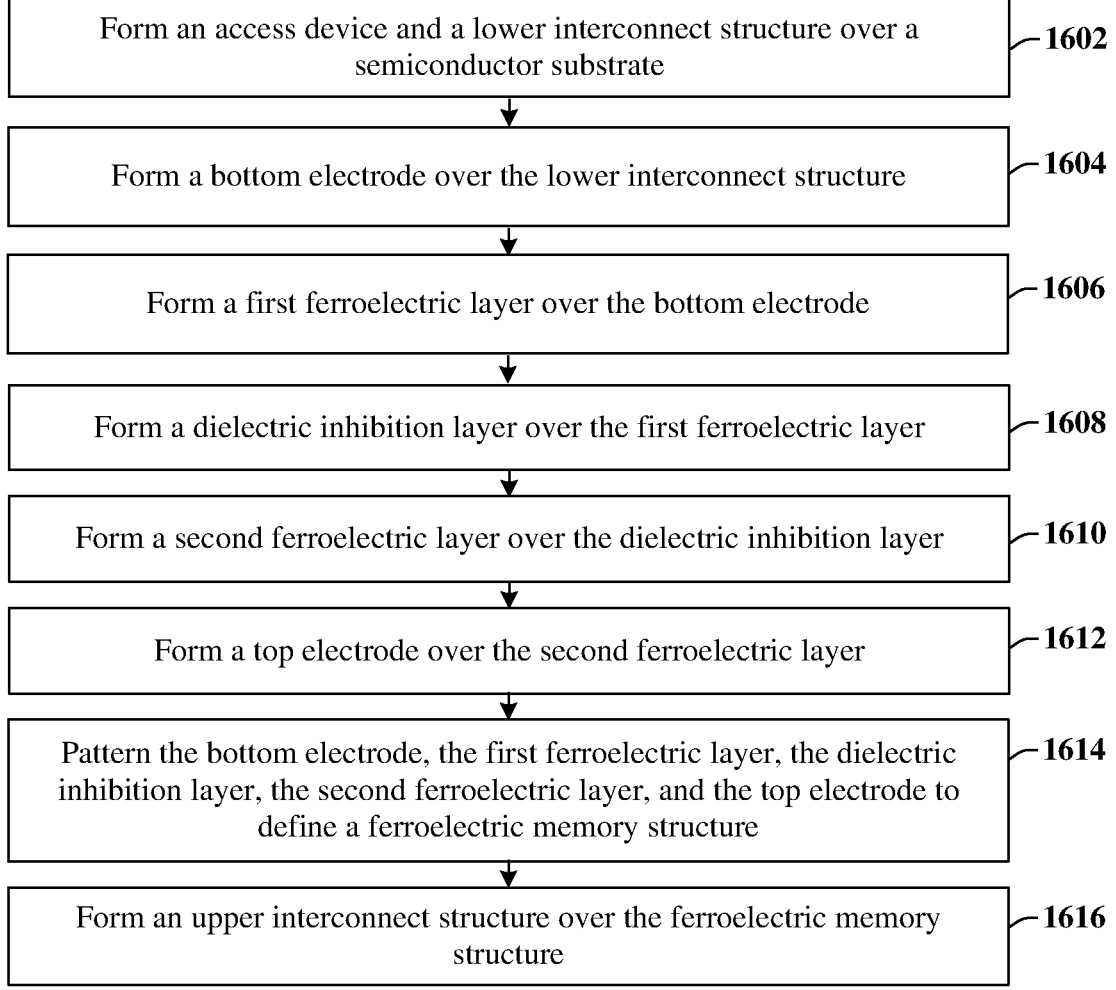

Form an access device and a lower interconnect structure over a semiconductor substrate ⟞1602

Form a bottom electrode over the lower interconnect structure ⟞1604

Form a first ferroelectric layer over the bottom electrode ⟞1606

Form a dielectric inhibition layer over the first ferroelectric layer ⟞1608

Form a second ferroelectric layer over the dielectric inhibition layer ⟞1610

Form a top electrode over the second ferroelectric layer ⟞1612

Pattern the bottom electrode, the first ferroelectric layer, the dielectric inhibition layer, the second ferroelectric layer, and the top electrode to define a ferroelectric memory structure ⟞1614

Form an upper interconnect structure over the ferroelectric memory structure ⟞1616

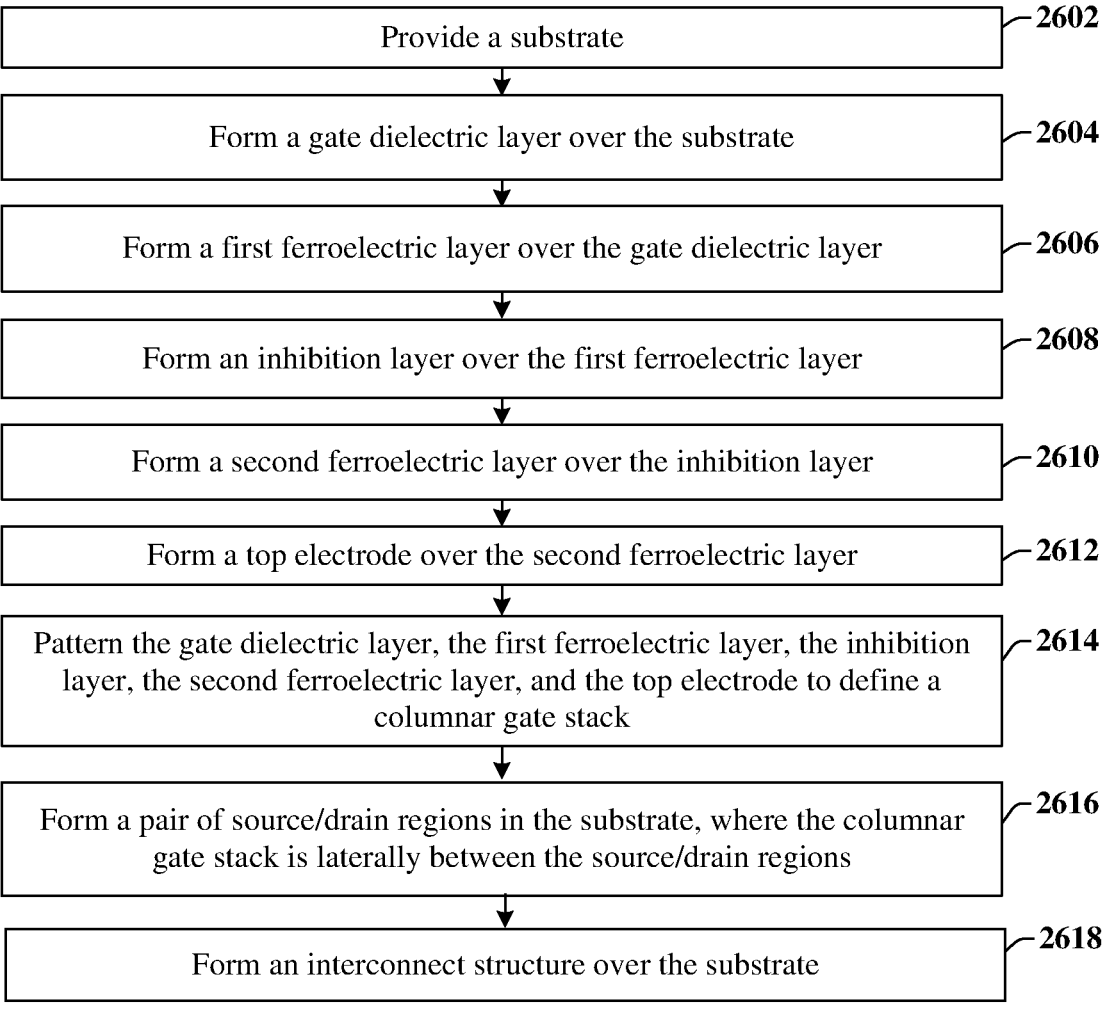

Provide a substrate — 2602

Form a gate dielectric layer over the substrate — 2604

Form a first ferroelectric layer over the gate dielectric layer — 2606

Form an inhibition layer over the first ferroelectric layer — 2608

Form a second ferroelectric layer over the inhibition layer — 2610

Form a top electrode over the second ferroelectric layer — 2612

Pattern the gate dielectric layer, the first ferroelectric layer, the inhibition layer, the second ferroelectric layer, and the top electrode to define a columnar gate stack — 2614

Form a pair of source/drain regions in the substrate, where the columnar gate stack is laterally between the source/drain regions — 2616

Form an interconnect structure over the substrate — 2618

Fig. 26

INSERTING INHIBITION LAYER FOR INDUCING ANTIFERROELECTRICITY TO FERROELECTRIC STRUCTURE

REFERENCE TO RELATED APPLICATION

This application claims the benefit of U.S. Provisional Application No. 63/420,131, filed on Oct. 28, 2022, the contents of which are hereby incorporated by reference in their entirety.

BACKGROUND

Many modern-day electronic devices include non-volatile memory. Non-volatile memory is electronic memory that is able to store data in the absence of power. A promising candidate for the next generation of non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 16 illustrates a block diagram of some embodiments of the method of FIGS. 7-15.

FIG. 26 illustrates a block diagram of some embodiments of the method of FIGS. 17-25.

DETAILED DESCRIPTION

Figure 1A:
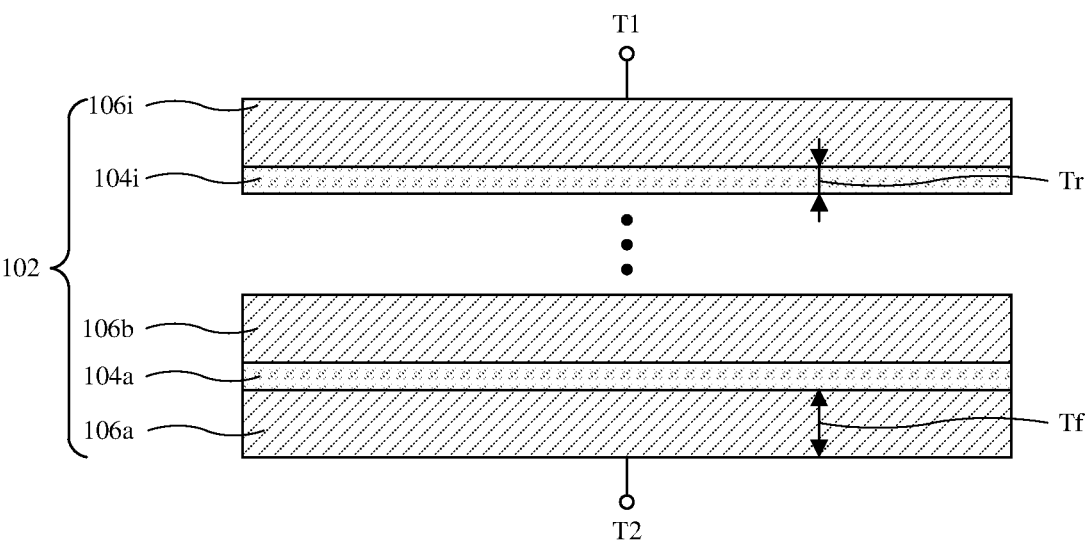
FIG. 1A illustrates a cross-sectional view of some embodiments of a ferroelectric structure with a dielectric insertion layer.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric materials are commonly used in non-volatile random access memory structures, such as FeRAM including a metal-ferroelectric-metal (MFM) capacitor structure connected to a drain/source of a field-effect-transistor (FET) or a ferroelectric field-effect transistors (FeFETs) including a ferroelectric film integrated into a gate dielectric stack of a FET. Digital data is stored in memory cells utilizing polarization properties of the ferroelectric materials. For example, for a FeRAM device, each memory cell may store digital data of binary "0" or "1" using one of two distinct polarization states of the MFM capacitor structure. The polarization states can be written or switched by applying an electric field and are maintained when removing the electric field. During reading operation, a reading bias is applied to the memory cell. If the reading bias changes the state of the memory cell, a relative large signal is detected. After removing the reading bias, the original data is restored. On the other hand, a relative small signal is detected if the data state is not changed by the reading bias.

The ferroelectric materials present three main crystalline phases: tetragonal, monoclinic, and orthorhombic. Amongst these three main crystalline phases, the orthorhombic phase exhibits a ferroelectric property of ferroelectricity (FE), while the tetragonal phase exhibits a ferroelectric property of antiferroelectricity (AFE). A ferroelectric structure with AFE properties may present four states that may include two positive polarization states and two negative polarization states, which may be used to store two digital bits in one memory cell. In comparison, the FE dominant structure only has one positive polarization state and one negative state for one bit storage. Thus, adopting AFE dominant ferroelectric structure can reduce memory sizes by increasing data storage densities.

One way to fabricate AFE dominant ferroelectric structure is to increase percentage of dopants. For example, a Zr dopant concentration of a hafnium zirconium oxide (HZO) may need to be increased to be greater than 70% to achieve tetragonal phase with AFE properties. This makes the HZO recipe more complicated and may lead to uneven Hf/Zr distribution in the HZO film. In addition, Zr-rich HZO shows a strong wake-up effect where the polarization increases with the increase of write/read electric field cycles. The wake-up effect negatively affects endurance and causes performance instability.

In view of the above, the present disclosure relates to a method to form an AFE dominant ferroelectric structure and an associated ferroelectric structure with improved endurance properties. In some embodiments, the ferroelectric structure may be formed by inserting an inhibition layer between a lower ferroelectric layer and an upper ferroelectric layer. The upper ferroelectric layer overlies the lower ferroelectric layer, and the inhibition layer borders the upper ferroelectric layer. The inhibition layer provides a break between crystalline lattices of the lower and upper ferroelectric layers, and change a dominant phase of the ferroelectric structure from the orthorhombic phase to the tetragonal phase. The tetragonal phase dominant ferroelectric layer present AFE properties. By properly introducing the inhibition layer, AFE is induced to the ferroelectric structure without significantly increasing doping level. Thus, dopants of the ferroelectric structure can be more evenly distributed, and wake-up effects is lessened or nearly freed compared to a higher doping structure absenting an inhibition layer. Thereby, stability of the ferroelectric structure can be improved with better ferroelectric endurance.

Further, thicknesses of the ferroelectric layers may be used to adjust the ferroelectric properties of the ferroelectric structure. Increasing a ferroelectric layer up to a critical thickness may increase the polarization difference (e.g., 2Pr). However, at and above the critical thickness, the lattice phase of the ferroelectric layer may be changed, and the ferroelectric properties become thermodynamically unstable, and the increase in polarization difference from thickness is negated. By inserting an inhibition layer, grain growth of the ferroelectric layer is interrupted, and thus the lattice phase of the ferroelectric layer can be tuned. As an example, an Alumina ($Al_2O_3$) inhibition layer may be deposited between a lower HZO layer and an upper HZO layer each having a thickness of up to a critical thickness of a tetragonal phase (e.g., 10 Å or 8 Å). Thus, the HZO layers may have tetragonal phase dominate and present stable AFE properties, such as four states for higher density data storage and/or nearly wake-up free for better endurance and stability.

FIG. 1A illustrates a cross-sectional view of some embodiments of a ferroelectric structure with a dielectric insertion layer. With reference to FIG. 1A, a cross-sectional view diagram of a ferroelectric structure 102 is provided. In some embodiments, the ferroelectric structure 102 comprises a first ferroelectric layer 106a, a second ferroelectric layer 106b overlying the first ferroelectric layer 106a, and a first inhibition layer 104a disposed between the first and second ferroelectric layers 106a, 106b. The first inhibition layer 104a may border the second ferroelectric layer 106b and/or the first ferroelectric layer 106a.

The first and second ferroelectric layers 106a, 106b respectively comprises a ferroelectric material. For example, the first and second ferroelectric layers 106a, 106b may be or be comprised of HZO. The first and second ferroelectric layers 106a, 106b may be further doped with aluminum (e.g., Al), silicon (e.g., Si), lanthanum (e.g., La), scandium (e.g., Sc), calcium (e.g., Ca), barium (e.g., Ba), gadolinium (e.g., Gd), yttrium (e.g., Y), strontium (e.g., Sr), some other suitable element(s), or any combination of the foregoing to increase polarization. In some embodiments, the first and second ferroelectric layers 106a, 106b may be or be comprised of $Hf_xZr_{1-x}O_2$ with x representing a ratio of Hf doping concentration compared to a sum of Hf and Zr doping concentrations. For example, when x is equal to 0.5, the amount of Hf atoms and Zr atoms are equally mixed for the composition of $Hf_{0.5}Zr_{0.5}O_2$. In some embodiments, Zr concentrations of the first and second ferroelectric layers 106a, 106b are in a range of about 40% to about 70%. A decreasing Zr concentration below 40% may lead to an increasing monoclinic phase with degraded polarization properties, and an increasing Zr concentration above 70% may lead to an uneven Hf/Zr distribution problems.

In some embodiments, the first inhibition layer 104a comprises a high-k dielectric material, such as a dielectric material with a dielectric constant greater than 3, or preferably greater than about 6 such that the first inhibition layer 104a does not cause capacitance leakage problem. In some embodiments, the first inhibition layer 104a is a material different from the first and second ferroelectric layers 106a, 106b. The first inhibition layer 104a may have a lattice constant at least 5% different from the first and second ferroelectric layers 106a, 106b, such that the first inhibition layer 104a can inhibit continuous grain growth between the first and second ferroelectric layers 106a, 106b. As an example, the first inhibition layer 104a may be or be comprised of Alumina ($Al_2O_3$). Alumina ($Al_2O_3$) has a dielectric constant about 9-10 and a lattice constant of about 4.8 Å. Other suitable material for the first inhibition layer 104a may include lanthanum oxide (e.g., $La_2O_3$), yttrium oxide (e.g., $Y_2O_3$), silicon oxide (e.g., $SiO_2$), titanium oxide (e.g., $TiO_2$), cerium oxide (e.g., $CeO_2$), or the like.

In some embodiments, the first and second ferroelectric layers 106a, 106b respectively has a thickness $T_f$ smaller than a first critical thickness, for example, 8 nm or 10 nm. The thickness $T_f$ may be further limited to smaller than 6 nm for more stable and enhanced performance. A continuous HZO layer (e.g. $Hf_{0.5}Zr_{0.5}O_2$) with a thickness greater than the first critical thickness (e.g. approximately 8 nm or 10 nm) and smaller than a second critical thickness (e.g. 20 nm) is orthorhombic dominant. By inserting the first inhibition layer 104a between the first and second ferroelectric layers 106a, 106b and limiting the thickness $T_f$ of the first and second ferroelectric layers 106a, 106b under the first critical thickness, the ferroelectric structure 102 presents more tetragonal properties as compared to a similar structure absenting the alumina film and with a greater thickness. Accordingly, in some embodiments, the first ferroelectric layer 106a and the second ferroelectric layer 106b have individual thicknesses $T_f$ of about 1-4 nanometers, about 1-6 nanometers, about 1-8 nanometers, about 1-10 nanometers, or some other suitable value. In some embodiments, the first ferroelectric layer 106a, the second ferroelectric layer 106b, or the whole ferroelectric structure 102 is tetragonal dominant and presents stable AFE properties. As will be discussed in more details with reference to FIG. 2A, the first and second ferroelectric layers 106a, 106b may have the same or different material compositions and thicknesses.

In some embodiments, the first inhibition layer 104a has a thickness $T_r$ approximately 2-3 Å. The first inhibition layer 104a may be formed by an atomic layer deposition (ALD) process by as simple as a few cycles or even one cycle. Accordingly, in some embodiments, the thickness $T_r$ of the first inhibition layer 104a may be less than 1 nanometer, such as about 0.1-0.3 nanometers, about 0.1-1 nanometers, or some other suitable value. The thickness $T_r$ of the first inhibition layer 104a may be greater than 2 Å or greater than dimensions of atoms of the first inhibition layer 104a. If the thickness Tr is too small, the inhibition layers 104 may fail to provide a meaningful break between crystalline lattices of bordering ferroelectric layers 106a, 106b. If the thickness Tr is too big (e.g. greater than 1 nm), ferroelectric properties of the ferroelectric structure 102 such as thermodynamic stability or remnant polarization level may be degraded. By placing the first inhibition layer 104a between the first and second ferroelectric layers 106a, 106b, the continuous grain growth of the ferroelectric layer is interrupted under the first critical thickness (e.g. approximately 8 nm or 10 nm), and thus results in a tuning of the ferroelectric structure 102 from orthorhombic phase to tetragonal phase, and from FE properties to AFE properties and improve endurance of the ferroelectric structure 102.

In some further embodiments as shown in FIG. 1A, the ferroelectric structure 102 may comprise additional one or more inhibition layers 104i and additional one or more ferroelectric layers 106i that are vertically stacked and alternate with one another. The inhibition layers 104a, 104i may be collectively referred as inhibition layers 104. The ferroelectric layers 106a, 106b, 106i may be collectively referred as ferroelectric layers 106. Further, the tetragonal phase may dominate in the ferroelectric layers 106. In other words, the tetragonal phase is a majority phase in the ferroelectric layers 106. The tetragonal phase exhibits useful four states polarizations and the inhibition layers 104. Additional layers of the ferroelectric layers 106 have properties similar as discussed above associated with the first ferroelectric layer 106a and the second ferroelectric layer 106b. Additional inhibition layers of the inhibition layers 104 have properties similar as discussed above associated with the first inhibition layer 104. In some embodiments, the ferroelectric layers 106 may have the same or different material compositions and thicknesses. In some embodiments, the inhibition layers 104 may have the same or different material compositions and thicknesses.

In some embodiments, the inhibition layers 104 promote the tetragonal phase in the ferroelectric layers 106 and/or inhibit the monoclinic phase in the ferroelectric layers 106. For example, the inhibition layers 104 may break grain growth of the ferroelectric layers 106 to be dominated by the tetragonal phase.

During operation, by appropriately biasing the ferroelectric structure 102, the polarizations of the ferroelectric layers 106 are changed between a first state and a second state. For example, applying a first voltage having a positive polarity from a first terminal T1 at a top of the ferroelectric structure 102 to a second terminal T2 at a bottom terminal of the ferroelectric structure 102 may set the first state. Further, applying a second voltage having a second polarity opposite the first polarity from the first terminal T1 to the second terminal T2 may set the second state.

Because the polarization may be electrically measured, the polarization may be employed to represent a bit of data. For example, the first state may represent a binary "1", whereas the second state may represent a binary "0", or vice versa. Further, the larger the difference in polarization between the first state and the second state (e.g., 2Pr), the larger the memory read window and hence the more resilient memory read operations are.

Figure 1B:
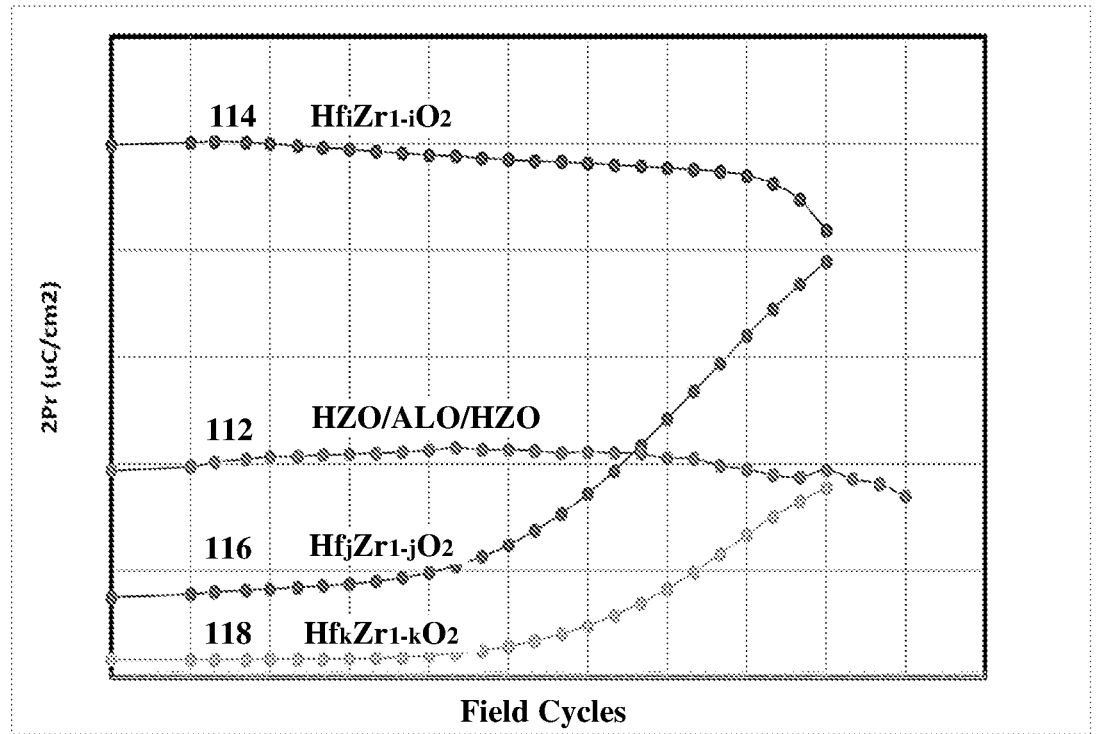
FIG. 1B illustrates a ferroelectric endurance diagram of some embodiments of a ferroelectric structure with a dielectric insertion layer.

FIG. 1B illustrates a ferroelectric endurance diagram of some embodiments of a ferroelectric structure with a dielectric insertion layer. With reference to FIG. 1B, a ferroelectric endurance diagram of a polarization value (2Pr) versus applied electric field cycles is provided for various ferroelectric structures. A first curve 112 represents a change of 2Pr as the applied electric field cycles increase for a ferroelectric structure with a dielectric insertion layer, for example, the ferroelectric structure 102 with the dielectric inhibition layers 104 as discussed above with reference to FIG. 1A, such as a HZO/Al$_2$O$_3$/HZO structure. As the electric field cycles applies, the 2Pr stays nearly constant (e.g., with a change of less than 10% after applying $10^8$ field cycles).

In addition, because of the breaks provided by the inhibition layers 104, the ferroelectric layers 106 may be formed vertically stacked and may each be formed with individual thicknesses $T_f$ up to the first critical thicknesses for tetragonal phase. This, in turn, allows a thickness of the ferroelectric structure 102 to be increased beyond the individual critical thicknesses of the ferroelectric layers 106 by increasing the number of ferroelectric layers 106 and inserting the inhibition layers 104. Hence, the ferroelectric structure 102 may have a larger polarization level (e.g., 2Pr) between the first state and the second state than would otherwise be possible without the inhibition layers 104. For example, the 2Pr may be greater than or around 10 μC/cm$^2$, or in a range of about 5-20 μC/cm$^2$, or some other suitable value.

In comparison, curves 114, 116, and 118 respectively represents a polarization level change (2Pr) as the applied electric field cycles increase for a ferroelectric structure with continuous ferroelectric layers absenting a dielectric insertion layer. The Zr concentration percentage increases in the order of curves 114, 116, and 118 (i.e., i>j>k). As shown by the curve 114, the ferroelectric structure with a lower Zr concentration percentage, for example, it may be equal to 0.53, Hf$_{0.53}$Zr$_{0.47}$O$_2$ shows a fatigue character, where 2Pr may decrease about 20% after applying $10^8$ field cycles. As shown by the curves 116 and 118, the ferroelectric structure with a higher Zr concentration percentage, for example, j may be equal to 0.3 or k may be equal to 0.23, Hf$_{0.3}$Zr$_{0.7}$O$_2$ or Hf$_{0.32}$Zr$_{0.77}$O$_2$ shows a wake-up character, where 2Pr may increase significantly (e.g. 300%) after applying $10^8$ field cycles. None of the curves 114, 116, and 118 shows good ferroelectric endurance properties. Thus, by placing dielectric insertion layers between ferroelectric layers, endurance properties of the ferroelectric structures are improved.

Figure 1C:
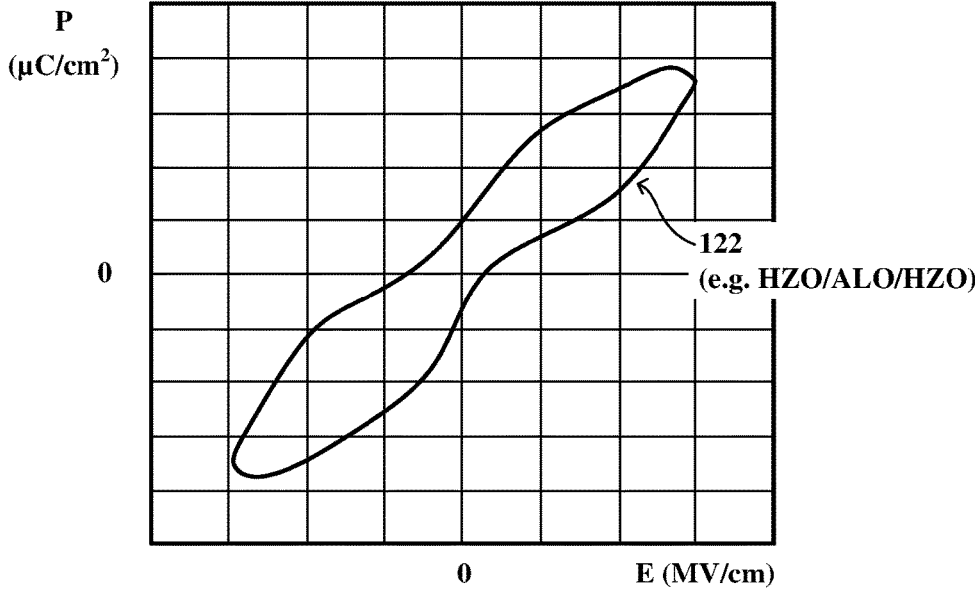
FIG. 1C illustrates a polarization-field diagram of some embodiments of a ferroelectric structure with a dielectric insertion layer.

FIG. 1C illustrates a polarization-field diagram of some embodiments of a ferroelectric structure with a dielectric insertion layer. The ferroelectric structure may be, for example, the ferroelectric structure 102, as discussed above with reference to FIGS. 1A-1B. As shown in FIG. 1C, the ferroelectric structure, represented by a curve 122, may present AFE properties such as double loop hysteresis with four states of polarizations, and the polarization level is maintained on a reasonable level, for example, around 10 μC/cm$^2$, or in a range of about 5-20 μC/cm$^2$.

FIGS. 2A-2D illustrate cross-sectional views of some embodiments of an IC in which a metal-ferroelectric-metal (MFM) structure 202 comprises a ferroelectric structure 102 with a dielectric insertion layer. The ferroelectric structure 102 may be as described above with regard to FIGS. 1A-1C. In some embodiments, the MFM structure 202 further comprises a bottom electrode 204 and a top electrode 206. The ferroelectric structure 102 overlies the bottom electrode 204, and the top electrode 206 overlies the ferroelectric structure 102. Further, the MFM structure 202 defines a capacitor that may, for example, be employed for data storage. In some embodiments, the MFM structure 202 defines the capacitor in a one-transistor one-capacitor (1T1C) memory structure as described below associated with FIG. 3 or some other suitable type of memory structure.

In some embodiments, the bottom electrode 204 or the top electrode 206 is or is comprised of titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Ir), molybdenum (e.g., Mo), osmium (e.g., Os), thorium (e.g., Th), vanadium (e.g., V), some other suitable metal(s), or any alloy or combination of the foregoing. In some embodiments, the bottom electrode 204 or the top electrode 206 has a thickness of about 15 nanometers, about 15-500 nanometers, or some other suitable thickness. The top electrode 206 may has the same or different compositions and/or thicknesses as the bottom electrode 204.

Figure 2A:
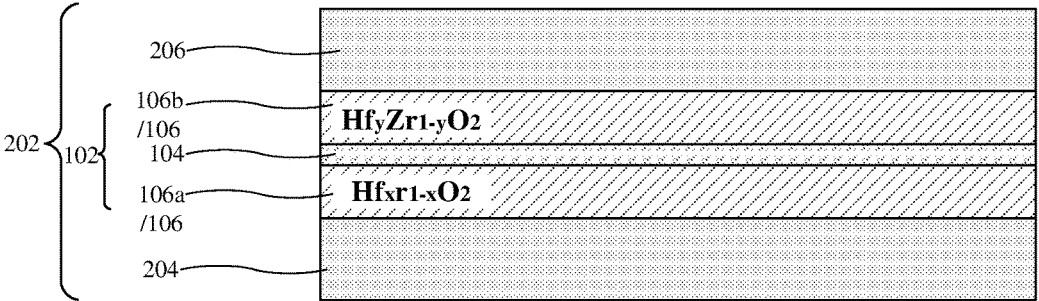
FIGS. 2A-2D illustrate cross-sectional views of some embodiments of an IC in which a metal-ferroelectric-metal (MFM) structure comprises a ferroelectric structure with a dielectric insertion layer.

In some embodiments, as shown in FIG. 2A, ferroelectric properties of the ferroelectric structure 102 may be tuned by compositions of the ferroelectric layers 106. The second ferroelectric layer 106b and the first ferroelectric layer 106a may be formed and thus may be with different ratios of the same elements. As an example, a first ferroelectric layer 106a may has a first composition $Hf_xZr_{1-y}O_2$ while the second ferroelectric layer 106b may has a second composition $Hf_yZr_{1-y}O_2$, where x may not be equal to y. For example, x may be around 0.5, and y may be around 0.6 or in a range of about 0.5 to 0.7.

Figure 2B:
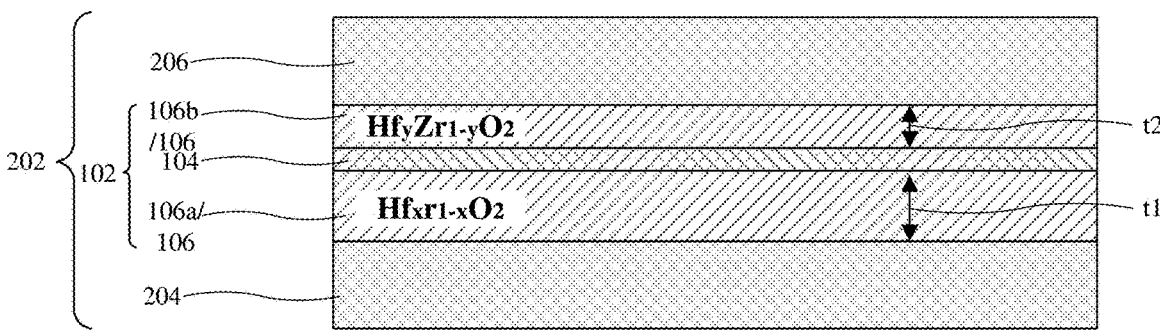

In some further embodiments, as shown in FIG. 2B, ferroelectric properties of the ferroelectric structure 102 may be tuned by thickness of the ferroelectric layers 106. As an example, a first ferroelectric layer 106a may has a first thickness t1 while the second ferroelectric layer 106b may has a second thickness t2, where t1 may not be equal to t2. For example, the second thickness t2 may be smaller than the first thickness t1, such as t1 may be 6 nm, while t2 may be 2 nm or vice versa.

Figure 2C:
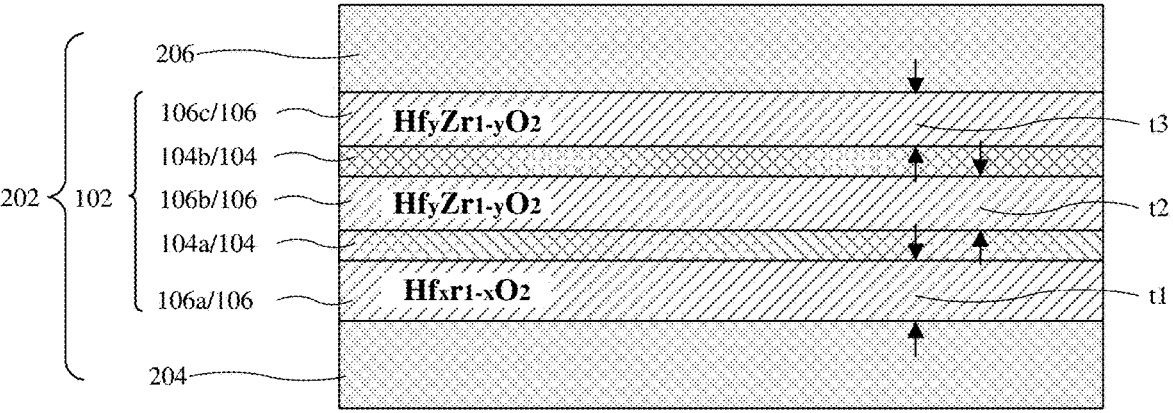

As shown in FIG. 2C, additional ferroelectric layers 106 and inhibition layers 104 may be arranged with various compositions and/or thicknesses to further tune ferroelectric properties of the ferroelectric structure 102. For example, a third ferroelectric layer 106c may be disposed directly on a second inhibition layer 104b with a third thickness T3. The third ferroelectric layer 106c may have the same material and thickness as the second ferroelectric layer 106b, which are different than the first ferroelectric layer 106a. By inserting additional inhibition layers 104 between ferroelectric layers 106, thicknesses of the ferroelectric layers 106 can be further reduced, and stronger AFE properties are presented as well as better ferroelectric endurance.

Figure 2D:
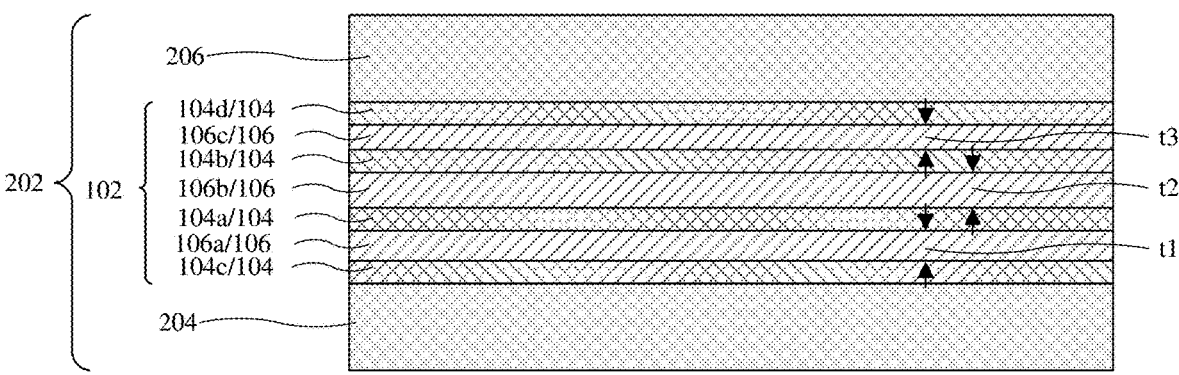

In some embodiments, as shown in FIGS. 2A-2C, the ferroelectric layers 106 directly board the bottom electrode 204 and/or the top electrode 206. In some alternative embodiments, the MFM structure 202 further comprises additional inhibition layers 104 directly boarding the bottom electrode 204 and/or the top electrode 206. For example, as shown in FIG. 2D, additional inhibition layers 104c, 104d may be disposed directly boarding the bottom electrode 204 and the top electrode 206, which may act as protecting layers to separate and protect the ferroelectric layers 106 from the bottom electrode 204 and the top electrode 206. The additional inhibition layers 104 may also be configured to stabilize a crystalline lattice of the ferroelectric layers to prevent thermodynamic instability of the tetragonal-phase. The additional inhibition layers 104 boarding the bottom electrode 204 and the top electrode 206 may be of the same material and thickness as the inhibition layers 104 inserted between the ferroelectric layers 106.

Figure 3:
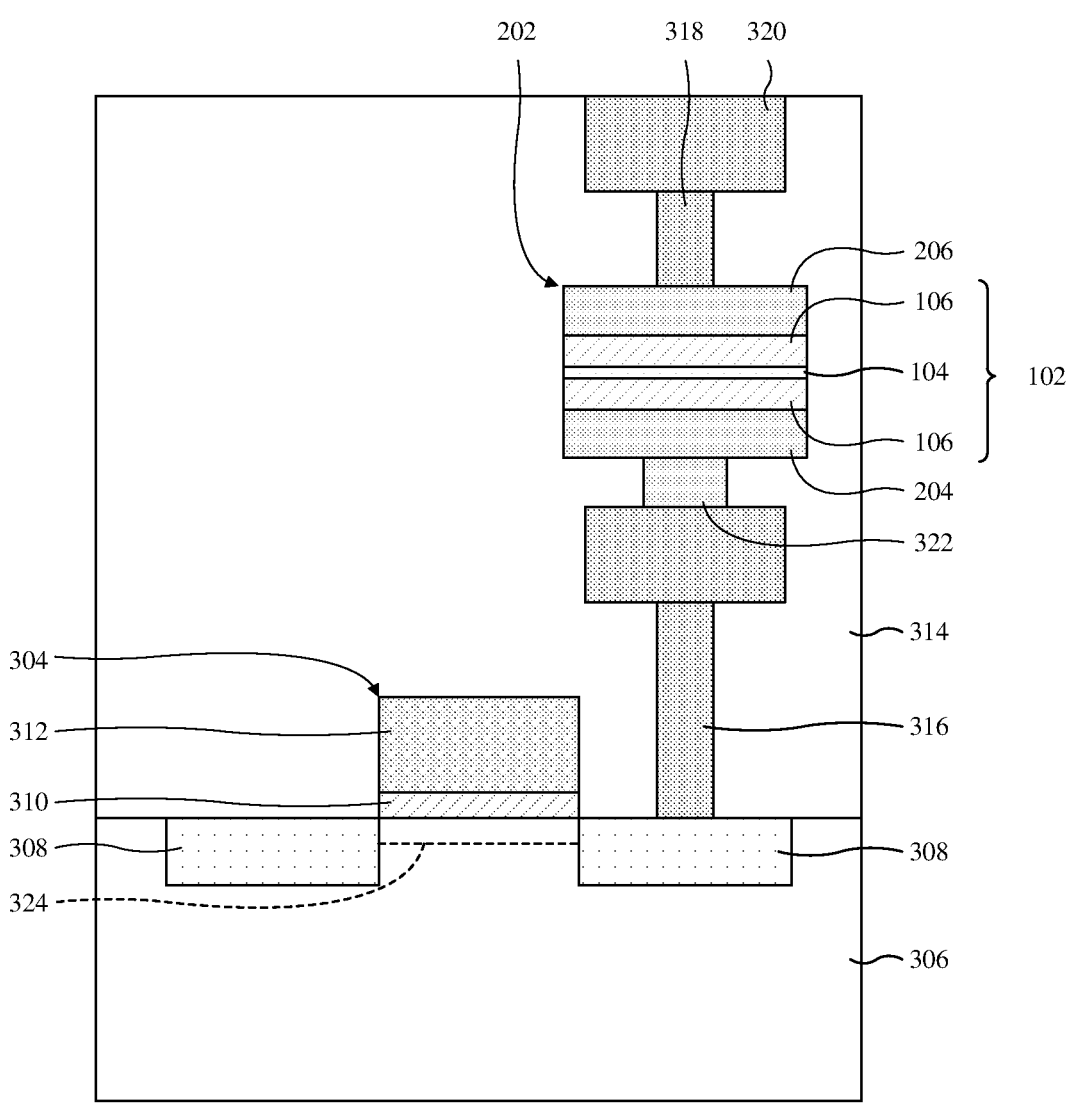
FIG. 3 illustrates a cross-sectional view of some embodiments of an IC in which a one-transistor one-capacitor (1T1C) memory structure comprises the MFM structure of FIGS. 2A-2D.

FIG. 3 illustrates a cross-sectional view of some embodiments of an IC in which a one-transistor one-capacitor (1T1C) memory structure comprises the MFM structure 202 of FIGS. 2A-2D. Though only a specific ferroelectric structure 102 similar as FIG. 2A is shown in FIG. 3, it is appreciated that various applicable embodiments of the ferroelectric structure 102 discussed above, such as associated with FIGS. 1A-1C and 2A-2D can be applied to the IC of FIG. 3.

The MFM structure 202 overlies and is electrically coupled to an access device 304. The access device 304 is on and partially defined by a substrate 306. Further, the access device 304 comprises a pair of source/drain regions 308, a gate dielectric layer 310, and a gate electrode 312. The source/drain regions 308 are embedded in a top of the substrate 306, and the gate dielectric layer 310 and the gate electrode 312 are stacked between the source/drain regions 308. In some embodiments, the access device 304 is a planar field-effect transistor (FET). In other embodiments, the access device 304 is a fin FET (FinFET), a gate-all-around (GAA) FET, or some other suitable type of semiconductor device.

An interconnect structure overlies the substrate 306 and electrically couples to the MFM structure 202 and the access device 304. As an example, the interconnect structure may comprise a contact via 316, an interlevel via 318, and a plurality of wires 320 in an interconnect dielectric layer 314. The contact via 316 extends from a bottom one of the wires 320 to one of the source/drain regions 308. Further, a bottom electrode via (BEVA) 322 of the MFM structure 202 is at a bottom of the MFM structure 202 and extends from the bottom electrode 204 to the bottom one of the wires 320. In some embodiments, the BEVA 322 is integrated with the bottom electrode 204. In alternative embodiments, the BEVA 322 is independent of the bottom electrode 204. The interlevel via 318 overlies the MFM structure 202 and extends from a top one of the wires 320 to the MFM structure 202.

During operation of the 1T1C structure, one or multiple bits of data are stored in the MFM structure 202 using the polarization of the ferroelectric structure 102 to represent the bit(s). To write, the gate electrode 312 is biased so a channel region 324 underlying the gate electrode 312 conducts and electrically connects the source/drain regions 308. A set voltage or a reset voltage is then applied across the MFM structure 202 through the channel region 324 of the access device 304 to set the polarization of the ferroelectric structure 102 to a first state. To read, the gate electrode 312 is again biased so the channel region 324 electrically connects the source/drain regions 308. The set or reset voltage is then applied across the MFM structure 202 through the channel region 324 of the access device 304. If the state of the polarization changes, a current pulse occurs. Otherwise, no current pulse occurs. Hence, the current pulse is used to identify the state of the polarization.

In some embodiments, the substrate 306 is a bulk substrate of silicon, an SOI substrate, or some other suitable semiconductor substrate. In some embodiments, the source/drain regions 308 are doped regions of the substrate 306. In other embodiments, the source/drain regions 308 are independent of the substrate 306 and are inset into a top of the substrate 306. In some embodiments, the gate electrode 312 is or is comprised of doped polysilicon, metal, some other suitable conductive material, or any combination of the foregoing. In some embodiments, the gate dielectric layer 310 is or comprises silicon oxide and/or some other suitable dielectric. In some embodiments, the wires 320, the inter-level via 318, the contact via 316, and the BEVA 322 are or are comprised of metal and/or some other suitable conductive material. In some embodiments, the interconnect dielectric layer 314 is or is comprised a dielectric oxide and/or some other suitable dielectric.

Figure 4:
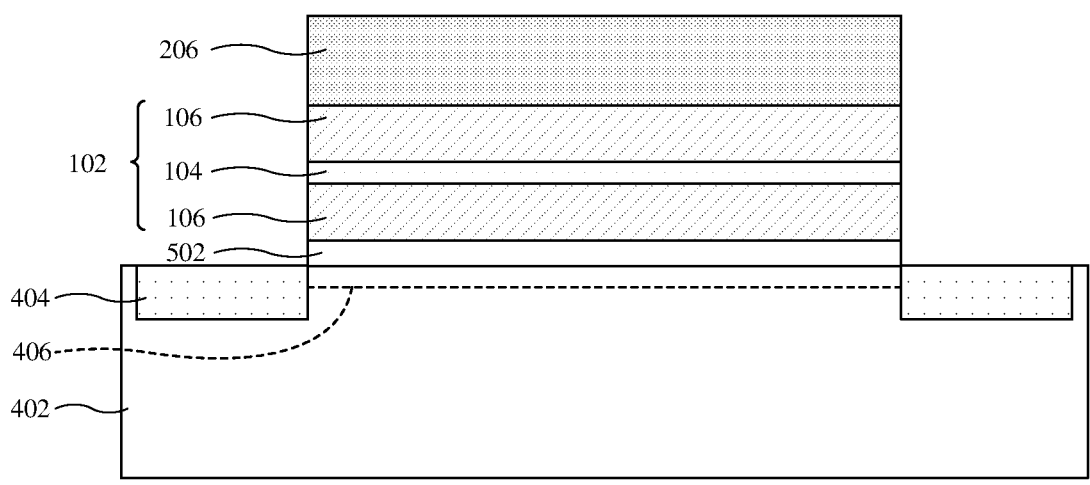
FIG. 4 illustrates a cross-sectional view of some embodiments of an IC in which a top gate FeFET structure comprises the ferroelectric structure of FIGS. 1A-1C.

FIG. 4 illustrates a cross-sectional view of some embodiments of an IC in which a top gate FeFET structure comprises the ferroelectric structure 102 of FIGS. 1A-1C. Though only a specific ferroelectric structure 102 similar as FIG. 2A is shown in FIG. 4, it is appreciated that various applicable embodiments of the ferroelectric structure 102 discussed above, such as associated with FIGS. 1A-1C and 2A-2D can be applied to the IC of FIG. 4. As shown in FIG. 4, a substrate 402 underlies the ferroelectric structure 102, and a top electrode 206 overlies the ferroelectric structure 102. A pair of source/drain regions 404 are embedded in a top of the substrate 402, respectively on opposite sides of the ferroelectric structure 102. Further, a channel region 406 extends between the source/drain regions 404, along the top of the substrate 402, and selectively conducts depending on a voltage from the top electrode 206 to a source one of the source/drain regions 404. For example, the channel region 406 may conduct when the voltage is more than a threshold voltage and may not conduct when the voltage is less than the threshold voltage, or vice versa. In some embodiments, the source/drain regions 404 are doped regions of the substrate 402. In other embodiments, the source/drain regions 404 are independent of and are inset into a top of the substrate 402. In some embodiments, a gate dielectric layer 502 is disposed over the substrate 402 underlying the ferroelectric structure 102.

During the operation of the top gate FeFET structure, the polarization of the ferroelectric structure 102 is employed to represent one or multiple bits of data. As an example, to write, a set voltage or a reset voltage is applied from the top electrode 206 to the channel region 406 (e.g., via the source/drain regions 404). The set voltage sets the polarization of the ferroelectric structure 102 to a first state, whereas the reset voltage sets the polarization to a second state. The threshold voltage varies with the state of the polarization. Therefore, to read, a read voltage less than the coercive voltage and between the different threshold voltage states is applied from the top electrode 206 to the source one of the source/drain regions 404. Depending on whether the channel layer 406 conducts, the polarization is in the first or second state, and thus a value of the stored data bit is determined.

In some embodiments, the substrate 402 is or is comprised of amorphous Indium-Gallium-Zinc-Oxide (a-IGZO), silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), or some other suitable group III-V material. The group II-VI material may, for example, be or comprise zinc oxide (e.g., ZnO), magnesium oxide (e.g., MgO), gadolinium oxide (e.g., GdO), or some other suitable II-VI material.

Figure 5:
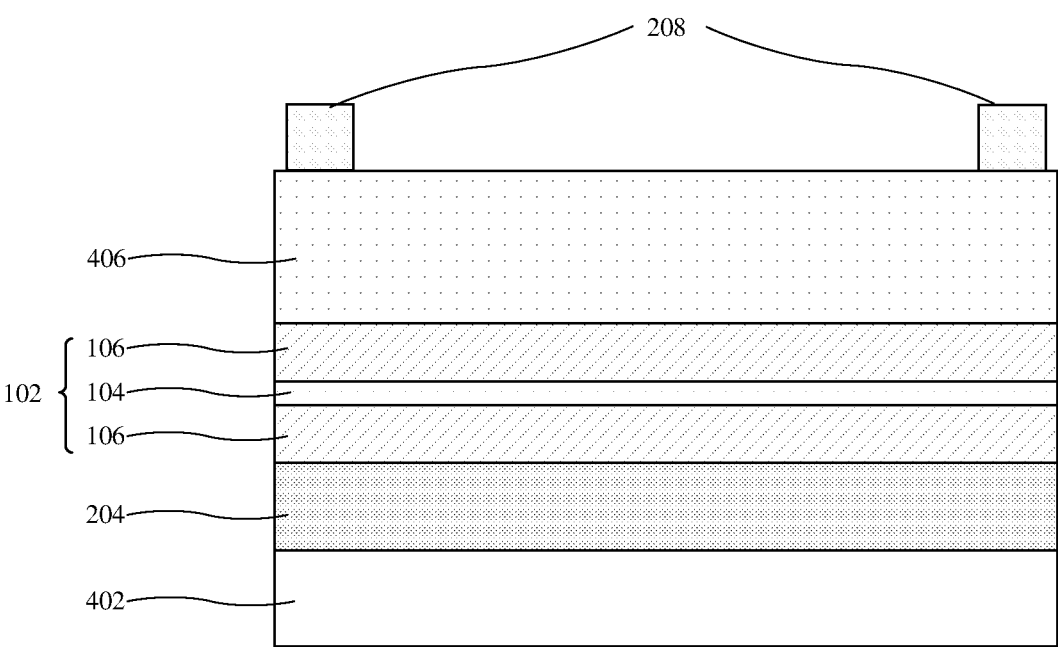
FIG. 5 illustrates a cross-sectional view of some embodiments of an integrated circuit (IC) in which a bottom gate ferroelectric field-effect transistor (FeFET) structure comprises the ferroelectric structure of FIGS. 1A-1C.

FIG. 5 illustrates a cross-sectional view of some embodiments of an integrated circuit (IC) in which a bottom gate ferroelectric field-effect transistor (FeFET) structure comprises the ferroelectric structure 102 of FIGS. 1A-1C. Though only a specific ferroelectric structure 102 similar as FIG. 2A is shown in FIG. 5, it is appreciated that various applicable embodiments of the ferroelectric structure 102 discussed above, such as associated with FIGS. 1A-1C and 2A-2D can be applied to the IC of FIG. 5. As shown in FIG. 5, a substrate 402 and a bottom electrode 204 may be vertically stacked and underlie the ferroelectric structure 102. Further, the bottom electrode 204 separates the substrate 402 from the ferroelectric structure 102. A channel layer 406 overlies the ferroelectric structure 102, and a pair of source/drain contacts 208 overlies the channel layer 406. Further, the source/drain contacts 208 are disposed on opposite sides of a top surface of the channel layer 406.

During operation of the bottom gate FeFET structure, the polarization of the ferroelectric structure 102 is employed to represent one or more bits of data. For example, for one bit data application, a first state of the polarization may represent a binary 1, whereas a second state of the polarization may represent a binary 0. For two bits data application, four states of the polarizations may respectively represent data state of 11, 10, 01, 00, for example.

To write to the bottom gate FeFET structure, a set voltage or a reset voltage is applied from the bottom electrode 204 to the channel layer 406 (e.g., via the source/drain contacts 208). The set and reset voltages have opposite polarities and magnitudes in excess of a coercive voltage of the ferroelectric structure 102. The set voltage sets the polarization of the ferroelectric structure 102 to the first state, whereas the reset voltage sets the polarization to second state, or vice versa.

To read from the bottom gate FeFET structure, a read voltage less than the coercive voltage of the ferroelectric structure 102 is applied from the bottom electrode 204 to a source one of the source/drain contacts 208. Depending on whether the channel layer 406 conducts, the polarization is in the first or second state.

More particularly, because the bottom gate FeFET structure is a FET, the channel layer 406 selectively conducts depending upon whether a voltage applied to the bottom electrode 204 exceeds a threshold voltage. Further, the ferroelectric structure 102 changes the threshold voltage based on a state of the polarization. Therefore, the channel layer 406 conducts based on the state of the polarization when the read voltage is between the different threshold voltage states.

In some embodiments, the substrate 402 comprises a semiconductor substrate and a dielectric layer covering the semiconductor substrate. The semiconductor substrate may, for example, be or comprise a monocrystalline silicon substrate, a silicon-on-insulator (SOI) substrate, a polymer substrate, or some other suitable type of semiconductor substrate. In some embodiments, the semiconductor substrate has a P-type doping type or some other suitable doping type. The dielectric layer may be or be comprised of, for example, silicon oxide (e.g., $SiO_2$) and/or some other suitable dielectric(s).

In some embodiments, the source/drain contacts 208 are or comprise copper, gold, some other suitable conductive material(s), or any combination of the foregoing. In some embodiments, the bottom electrode 204 is or comprises titanium nitride (e.g., TiN), tantalum nitride (e.g., TaN), platinum (e.g., Pt), titanium (e.g., Ti), tantalum (e.g., Ta) tungsten (e.g., W), iron (e.g., Fe), nickel (e.g., Ni), beryllium (e.g., Be), chromium (e.g., Cr), cobalt (e.g., Co), antimony (e.g., Sb), iridium (e.g., Ir), molybdenum (e.g., Mo), osmium (e.g., Os), thorium (e.g., Th), vanadium (e.g., V), some other suitable metal(s), or any alloy or combination of the foregoing. In some embodiments, the bottom electrode 204 has a thickness of about 15 nanometers, about 15-500 nanometers, or some other suitable thickness. In some embodiments, the bottom electrode 204 has a smaller coefficient of thermal expansion than an immediately overlying layer (e.g., a bottom one of the ferroelectric layers 106), such that the bottom electrode 204 applies tensile stress on the immediately overlying layer.

In some embodiments, the channel layer 406 is or comprises amorphous Indium-Gallium-Zinc-Oxide (a-IGZO) and/or some other suitable material, and/or has a thickness of about 10 nanometers or some other suitable value. In some embodiments, the channel layer 406 is or comprises silicon, silicon germanium, a group III-V material, a group II-VI material, some other suitable semiconductor material, or any combination of the foregoing. The group III-V material may, for example, be or comprise gallium arsenide (e.g., GaAs), gallium arsenide indium (e.g., GaAsIn), some other suitable group III-V material, or any combination of the foregoing. The group II-VI material may, for example, be or comprise zinc oxide (e.g., ZnO), magnesium oxide (e.g., MgO), gadolinium oxide (e.g., GdO), some other suitable II-VI material, or any combination of the foregoing.

Figure 6:
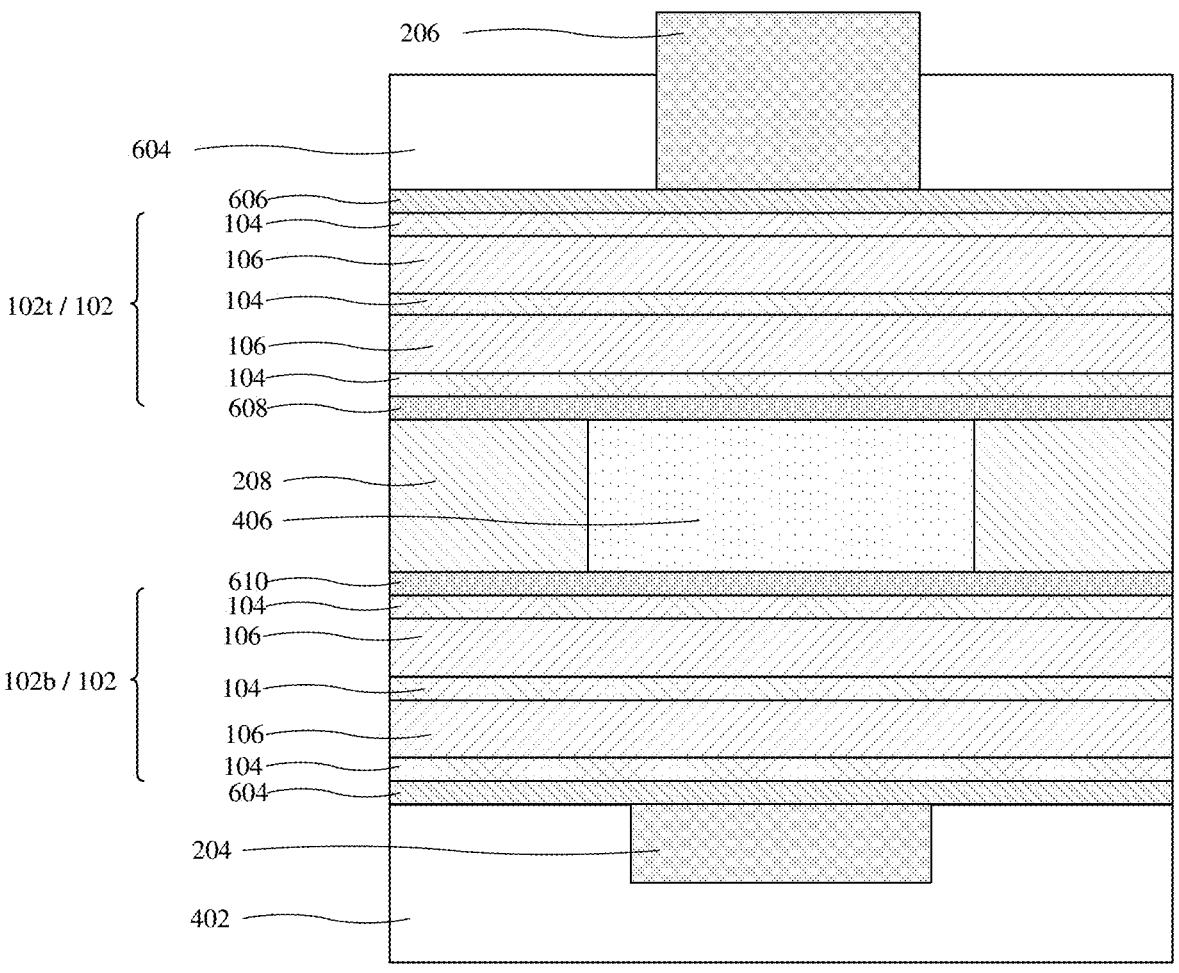
FIG. 6 illustrates a cross-sectional view of some embodiments of an IC in which a double gate FeFET structure comprises the ferroelectric structure of FIGS. 1A-1C.

FIG. 6 illustrates a cross-sectional view of some embodiments of an IC in which a double gate FeFET structure comprises the ferroelectric structure 102 of FIGS. 1A-1C. For example, the double gate FeFET structure comprises a bottom stacked ferroelectric structure 102b and a top stacked ferroelectric structures 102t. The stacked ferroelectric structures 102 are each as described with regard to FIGS. 1A-1C. Though only specific ferroelectric structures 102 similar as FIG. 2A is shown in FIG. 6, it is appreciated that various applicable embodiments of the ferroelectric structure 102 discussed above, such as associated with FIGS. 1A-1C and 2A-2D can be applied to the IC of FIG. 6. Further, the stacked ferroelectric structures 102 respectively overlie and underlie a channel layer 406.

A substrate 402 and a bottom electrode 204 underlie the stacked ferroelectric structures 102, and the bottom electrode 204 is inset into a top of the substrate 402. In alternative embodiments, the bottom electrode 204 is not inset into the top of the substrate 402 and has a bottom surface overlying a top surface of the substrate 402. Further, a top electrode 206 and a passivation layer 604 overlie the stacked ferroelectric structures 102, and the top electrode 206 extends through the passivation layer 604 to the top stacked ferroelectric structure 102t. In some embodiments, the passivation layer 604 is or comprise silicon oxide, silicon nitride, some other suitable dielectrics, or any combination of the foregoing. One or more dielectric layers 604, 610, 608, and 606 may be respectively disposed between the channel layer 406 and the bottom electrode 204 or the top electrode 206 on opposite sides of the top stacked ferroelectric structure 102t and the bottom stacked ferroelectric structure 102b. A pair of source/drain contacts 208 are respectively on opposite sides of the channel layer 406.

The dual gate FeFET structure operates similar to the top gate FeFET of FIG. 4 and the bottom gate FeFET of FIG. 5. Polarizations of the stacked ferroelectric structures 102 are employed to represent a bit of data. Further, the stacked ferroelectric structures 102 are controlled so the polarizations maintain the same polarity (e.g., same states). Note that a polarity of the bottom stacked ferroelectric structure 102b is from the bottom electrode 204 to the channel layer 406, whereas a polarity of top stacked ferroelectric structure 102t is from the top electrode 206 to the channel layer 406. Because the polarizations maintain the same polarity, the polarizations are additive and the change in threshold voltage between data states is doubled compared to a single gate FeFET structure. This, in turn, increases the size of the reading window and hence increases the reliability of read operations.

FIGS. 7-15 show a series of cross-sectional views of some embodiments of a method for forming a 1T1C ferroelectric memory device comprising inhibition layers inserted between ferroelectric layers. The memory device may, for example, be as described with regard to FIG. 3. Although FIGS. 7-15 are described in relation to a method, it will be appreciated that the structures disclosed in FIGS. 7-15 are not limited to such a method, but instead may stand alone as structures independent of the method. In addition, though FIGS. 7-15 show the formation of a specific ferroelectric structure 102, other ferroelectric structures described in this disclosure may be formed in similar manners.

Figure 7:
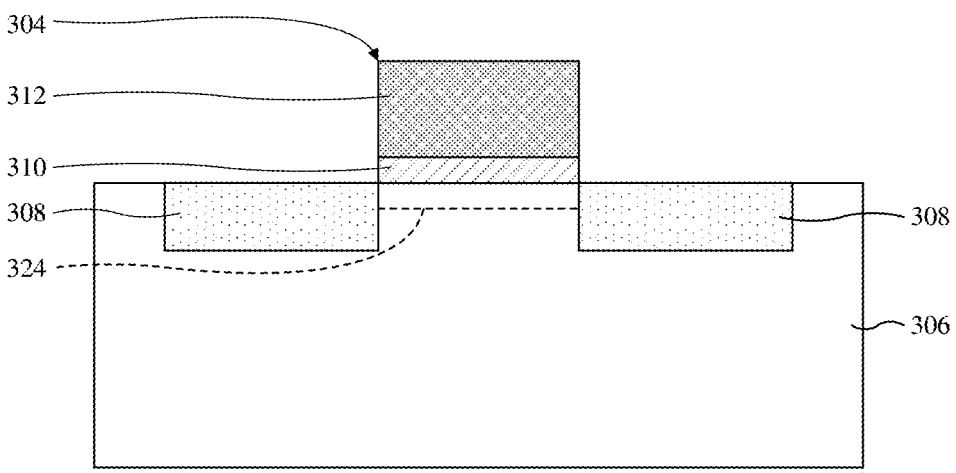
FIGS. 7-15 illustrate a series of cross-sectional views of some embodiments of a method for forming a 1T1C ferroelectric memory device comprising inhibition layers.

As illustrated by the cross-sectional view 700 of FIG. 7, an access device 304 is formed on a substrate 306. The access device 304 comprises a pair of source/drain regions 308, a gate dielectric layer 310, and a gate electrode 312.

Figure 8:
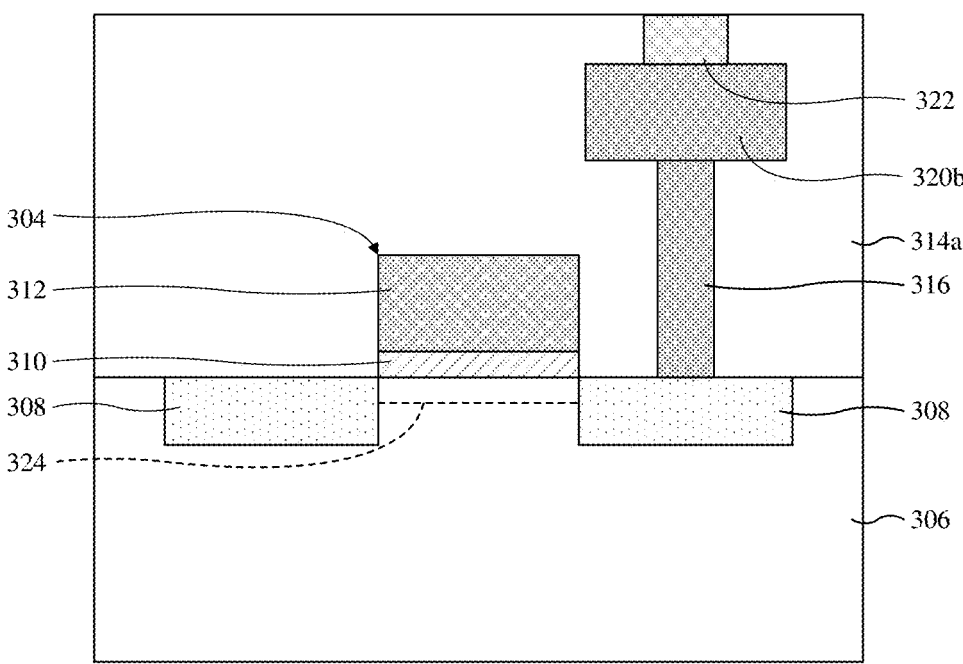

As illustrated by the cross-sectional view 800 of FIG. 8, a lower interconnect dielectric layer 314a is formed over the access device 304. Further, a lower interconnect structure is formed in the lower interconnect dielectric layer 314a. As an example, the lower interconnect structure may comprise a contact via 316, a bottom wire 320b overlying the contact via 316, and a bottom electrode via (BEVA) 322 overlying the bottom wire 320b.

Figure 9:
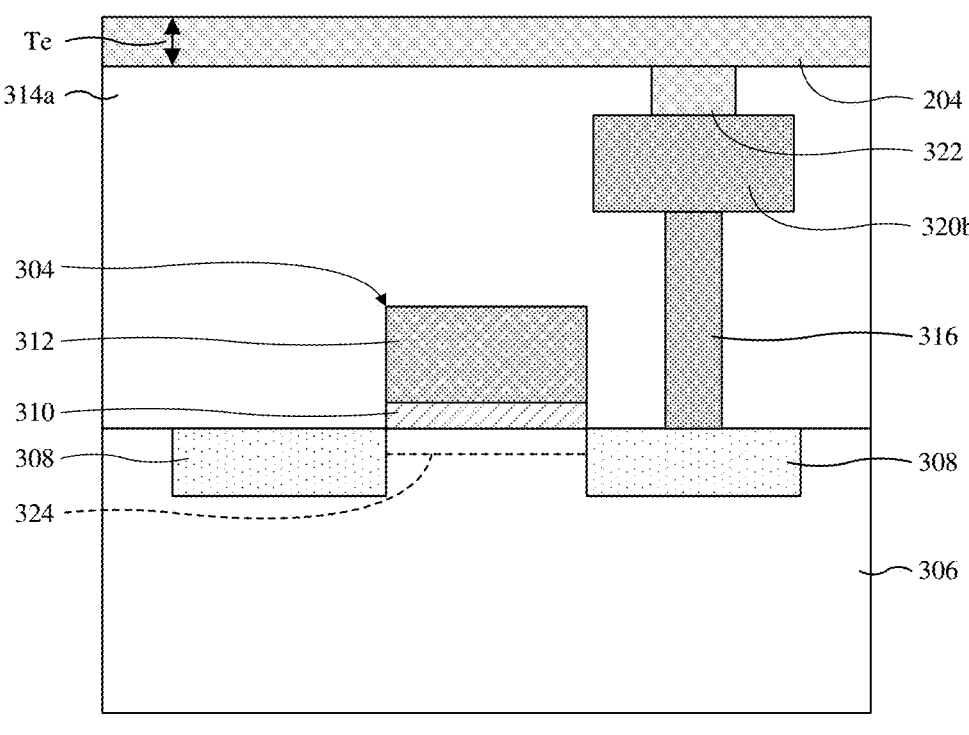

As illustrated by the cross-sectional view 900 of FIG. 9, a bottom electrode 204 is formed over the BEVA 322. The bottom electrode 204 has a thickness Te ranging from about 100-1000 Angstroms, about 100-500 Angstroms, about 250-750 Angstroms, about 500-1000 Angstroms, or some other suitable value. A process for forming the bottom electrode 204 may be or be comprised of depositing the bottom electrode 204 by direct current (DC) sputtering, physical vapor deposition (PVD), chemical vapor deposition (CVD), atomic layer deposition (ALD), some other suitable deposition process, or any combination of the foregoing.

Figure 10:
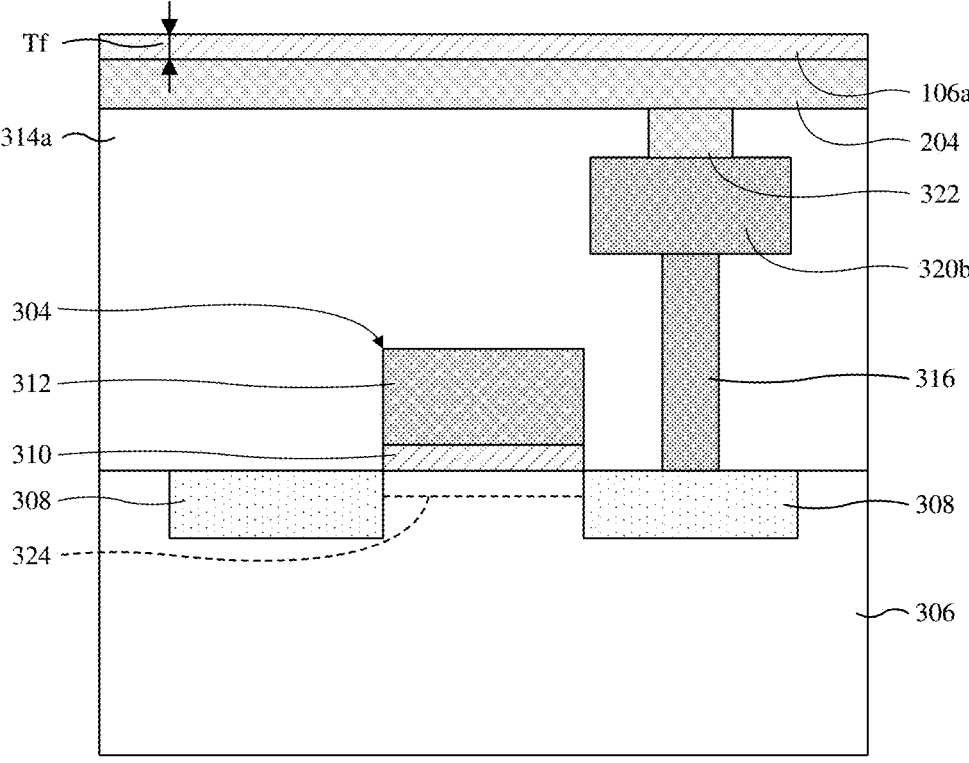

As illustrated by the cross-sectional view 1000 of FIG. 10, a first ferroelectric layer 106a is formed over the bottom electrode 204. In some embodiments, a process for forming the first ferroelectric layer 106a comprises depositing a ferroelectric material as an amorphous layer and then crystallizing with a thermal anneal. The thermal anneal may, for example, be performed at about 300-800 degrees Celsius or some other suitable temperature. In other embodiments, the process for forming the first ferroelectric layer 106a comprises depositing a ferroelectric material crystallized. The depositing process may, for example, be or comprise ALD and/or some other suitable deposition process. The ALD may, for example, be performed at or above about 300 degrees Celsius or at some other suitable temperature.

Figure 11:
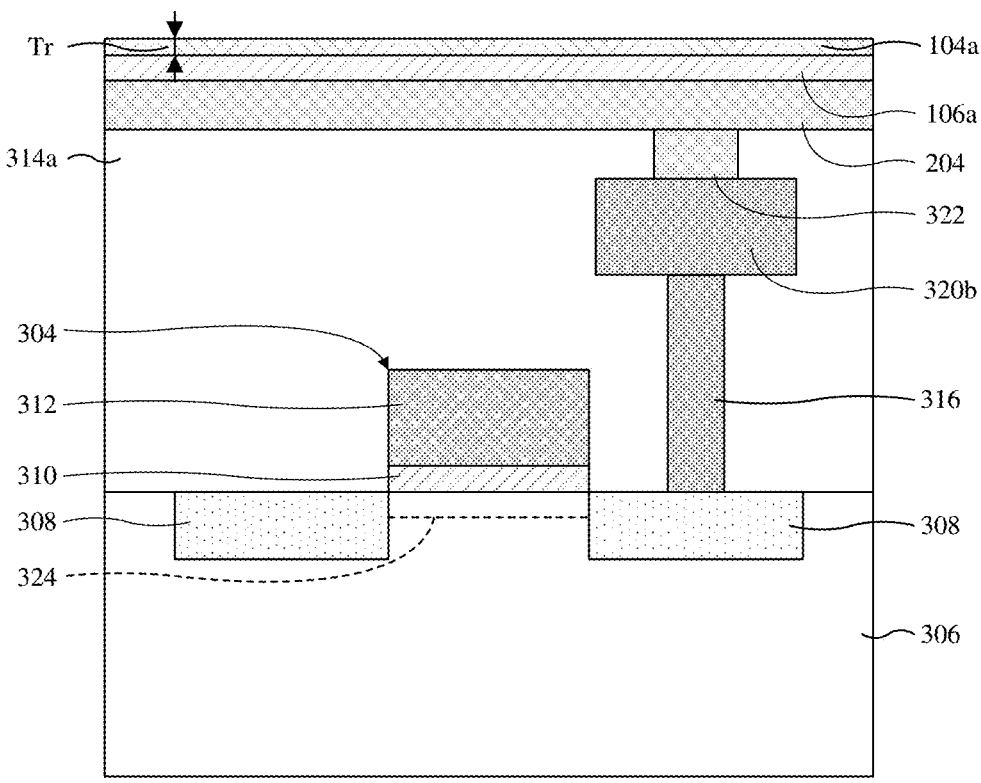

As illustrated by the cross-sectional view 1100 of FIG. 11, an inhibition layer 104a is formed over the first ferroelectric layer 106a. A process for forming the first inhibition layer 104a may be or be comprised of depositing the first inhibition layer 104a by an ALD process by as simple as a few cycles or even one cycle. The first inhibition layer 104a may have a lattice constant at least 5% different from the first and second ferroelectric layers 106a, 106b, such that the first inhibition layer 104a can inhibit continuous grain growth between the first and second ferroelectric layers 106a, 106b. In some embodiments, the first inhibition layer 104a has a thickness $T_r$ approximately or smaller than 1 Å. In some embodiments, the thickness $T_r$ of the first inhibition layer 104a may be less than 0.1 nanometers, about 0.1-0.3 nanometers, about 0.1-1 nanometers, or some other suitable value.

Figure 12:
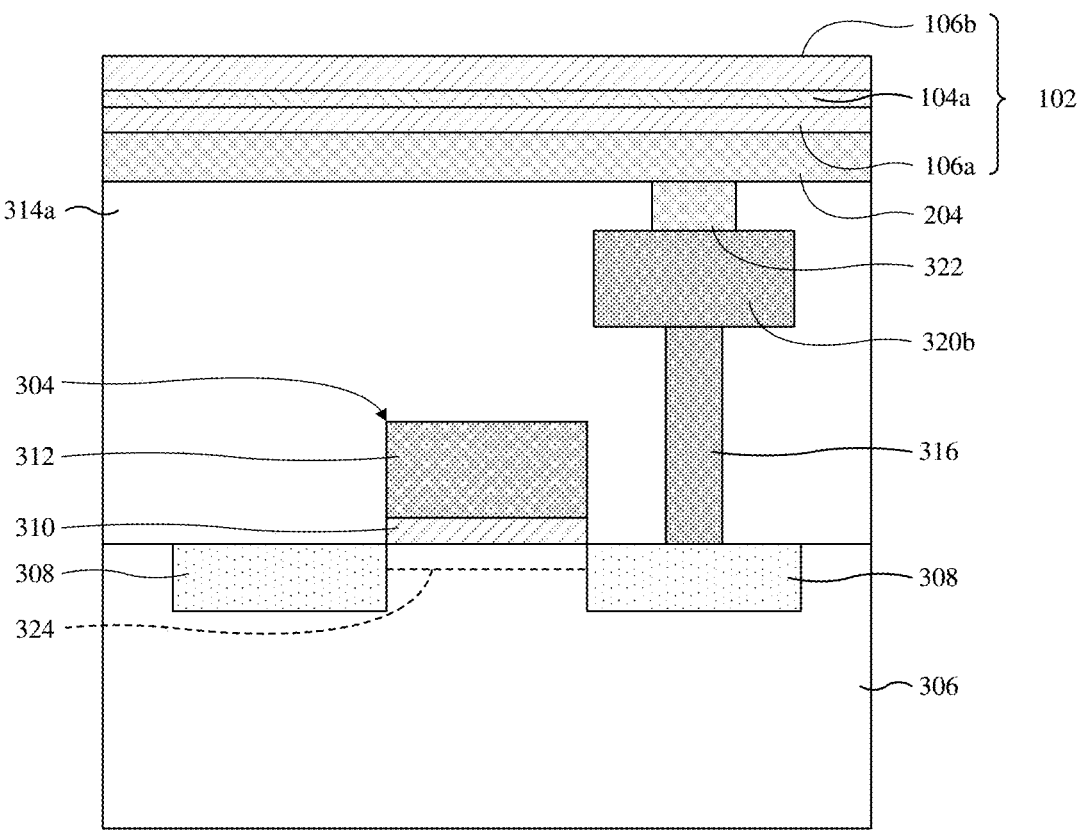

As illustrated by the cross-sectional view 1200 of FIG. 12, a second ferroelectric layer 106b is formed over the inhibition layer 104a. A process for forming the second ferroelectric layer 106b may be similar as forming the first ferroelectric layer 106a. In some embodiments, the first and second ferroelectric layers 106a, 106b respectively has a thickness $T_f$ smaller than a first critical thickness, for example, 8 nm or 10 nm. The thickness $T_f$ may be further limited to smaller than 6 nm for more stable and enhanced performance. By limiting the thickness $T_f$ of the first and second ferroelectric layers 106a, 106b under the first critical thickness and inserting the first inhibition layer 104a between the first and second ferroelectric layers 106a, 106b, the ferroelectric structure 102 presents more tetragonal properties as compared to a similar structure absenting the inhibition layers 104 and with a greater thickness.

Accordingly, in some embodiments, the first ferroelectric layer 106a and the second ferroelectric layer 106b have individual thicknesses $T_f$ of about 1-4 nanometers, about 1-6 nanometers, about 1-8 nanometers, about 1-10 nanometers, or some other suitable value. By placing the first inhibition layer 104a between the first and second ferroelectric layers 106a, 106b, the continuous grain growth of the ferroelectric layer is interrupted under the first critical thickness (e.g. approximately 8 nm or 10 nm), and thus results in a tuning of the ferroelectric structure 102 from orthorhombic phase to tetragonal phase, and from FE properties to AFE properties and improve endurance of the ferroelectric structure 102. In some embodiments, the first ferroelectric layer 106a, the second ferroelectric layer 106b, or the whole ferroelectric structure 102 is tetragonal dominant and presents stable AFE properties.

Figure 13:
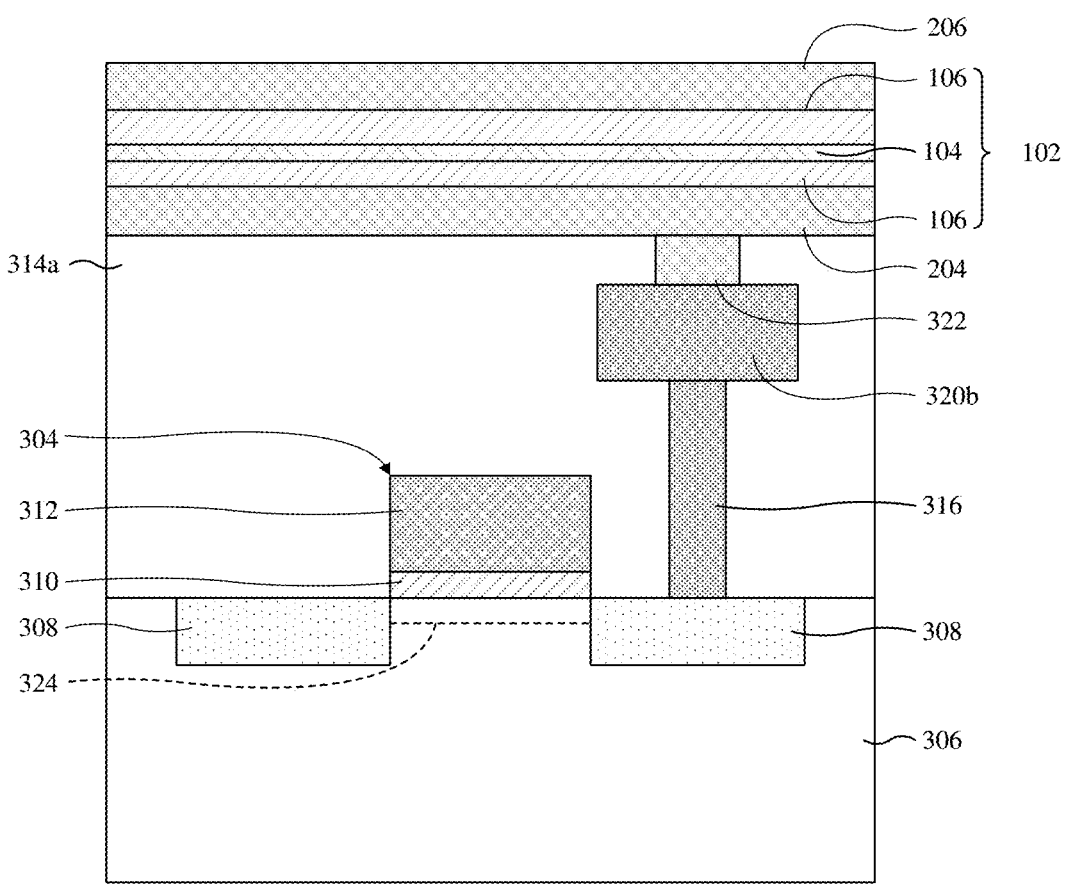

As illustrated by the cross-sectional view 1300 of FIG. 13, a top electrode 206 is formed over the second ferroelectric layer. A process for forming the top electrode 206 may be or be comprised of depositing the top electrode 206 by DC sputtering, PVD, CVD, ALD, some other suitable deposition process, or any combination of the foregoing. Further, the process may, for example, comprise annealing. The annealing may, for example, be performed at about 400-900 degrees Celsius to reduce stress and/or enhance crystallinity of the ferroelectric layers 106. Further, the annealing may, for example, be performed in an atmosphere comprising nitrogen gas (e.g., $N_2$), argon gas, oxygen gas (e.g., $O_2$), some other suitable gas, or any combination of the foregoing.

Figure 14:
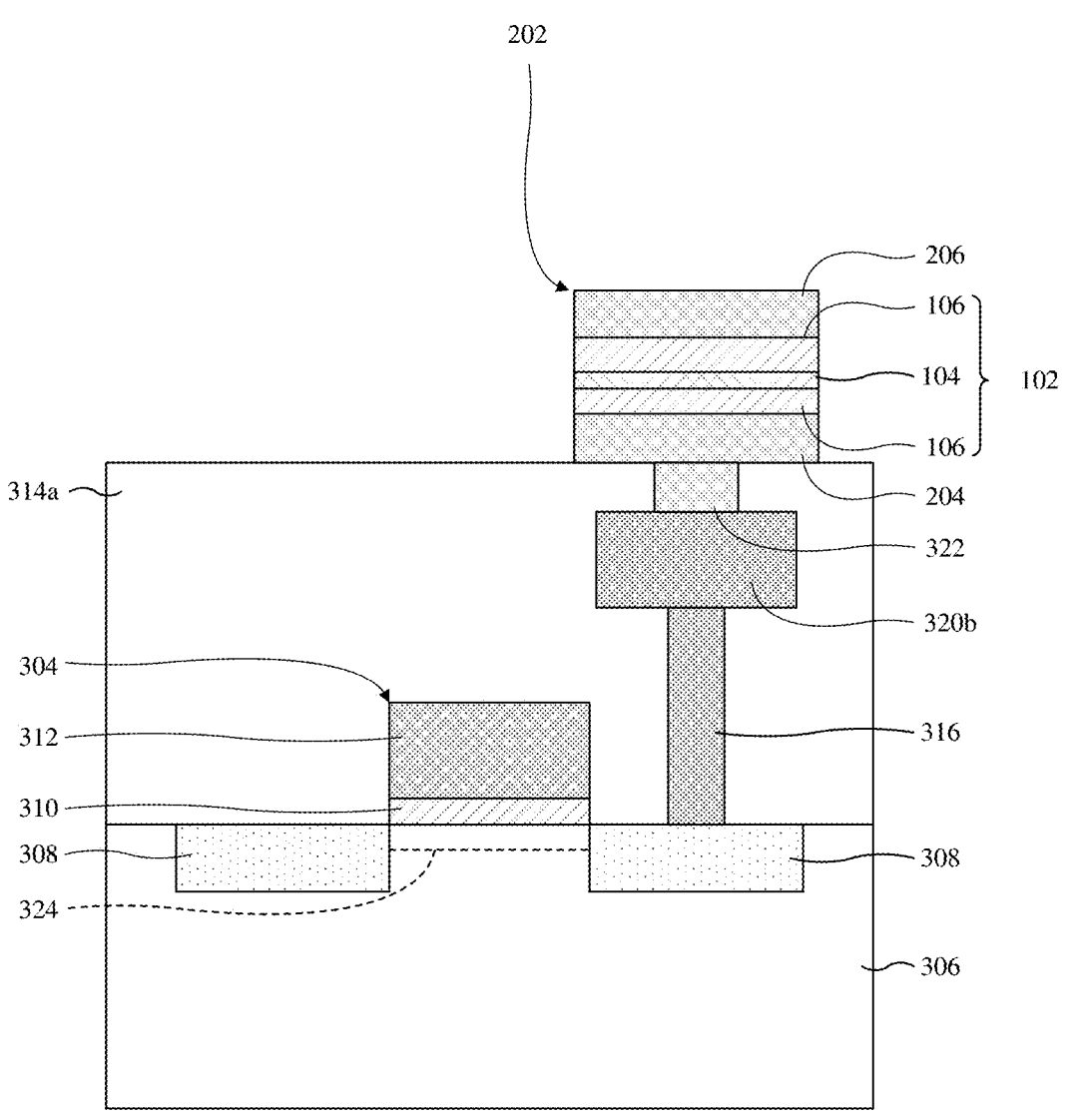

As illustrated by the cross-sectional view 1400 of FIG. 14, the bottom electrode 204, the first ferroelectric layer 106a, the inhibition layer 104, the second ferroelectric layer 106b, and the top electrode 206 are patterned to define a MFM structure 202. The patterning may, for example, be performed by a photolithography/etching process and/or by some other suitable process. In some embodiments, the patterning comprises: forming a hard mask (not shown) over the top electrode 206 using a photolithography/etching process; and subsequently etching the bottom electrode 204, the first ferroelectric layer 106a, the inhibition layer 104, the second ferroelectric layer 106b, and the top electrode 206 with the hard mask in place.

Figure 15:
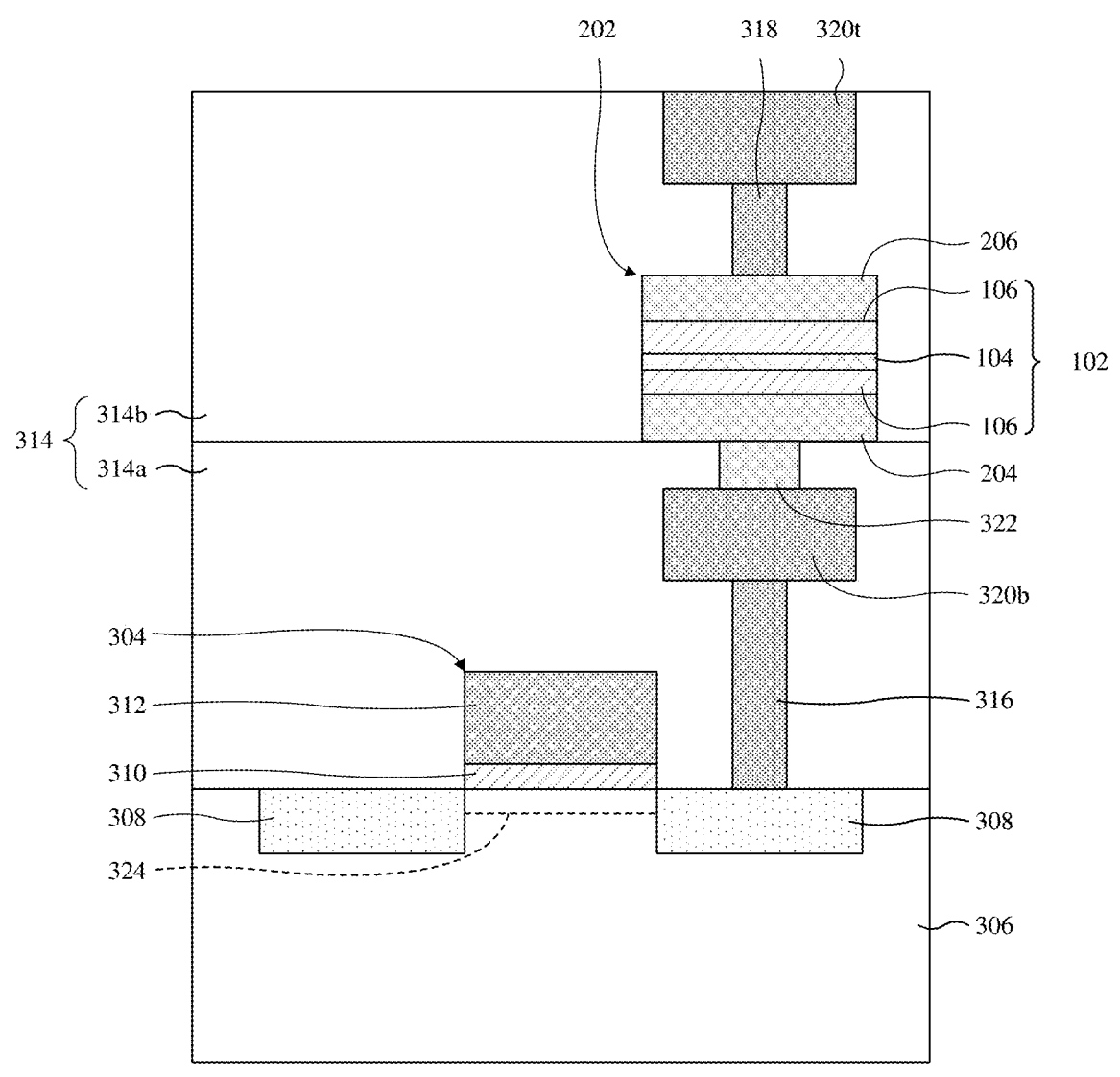

As illustrated by the cross-sectional view 1500 of FIG. 15, an upper interconnect dielectric layer 314b is formed over the lower interconnect dielectric layer 314a, such that the upper interconnect dielectric layer 314b and the lower interconnect dielectric layer 314a form an interconnect dielectric structure 314. Further, an upper interconnect structure is formed in the upper interconnect dielectric layer 314b. The upper interconnect structure comprises an inter-level via 318 overlying the MFM structure 202 and further comprises a top wire 320t overlying the interlevel via 318.

With respect to FIG. 16, a flowchart illustrating some embodiments of a method for forming a memory device comprising inhibition layers is provided. The method may, for example, correspond to the method of FIGS. 7-15.

While the disclosed flowchart is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, an access device and a lower interconnect structure are formed over a semiconductor substrate. See, for example, FIGS. 7-8.

At 1604, a bottom electrode is formed over lower interconnect structure. See, for example, FIG. 9.

At 1606, a first ferroelectric layer is formed over the bottom electrode layer. See, for example, FIG. 10.

At 1608, a dielectric inhibition layer is formed over the first ferroelectric layer. See, for example, FIG. 11.

At 1610, a second ferroelectric layer is formed over the dielectric inhibition layer. See, for example, FIG. 12.

At 1612, a top electrode is formed over the second inhibition layer. See, for example, FIG. 13.

At 1614, the bottom electrode, the first ferroelectric layer, the dielectric inhibition layer, the second ferroelectric layer, and the top electrode are patterned to define a ferroelectric memory structure. See, for example, FIG. 14.

At 1616, an upper interconnect structure is formed over the ferroelectric memory structure. See, for example, FIG. 15.

FIGS. 17-25 show a series of cross-sectional views of some embodiments of a method for forming a memory device in which a 1T ferroelectric memory device comprising an inhibition layer is provided. The memory device may, for example, be as described with regard to FIG. 4. Although FIGS. 17-25 are described in relation to a method, it will be appreciated that the structures disclosed in FIGS. 17-25 are not limited to such a method, but instead may stand alone as structures independent of the method. In addition, though FIGS. 17-25 show the formation of a top gate FeFET with the specific ferroelectric structure 102, other memory device structures described in this disclosure, such as but not limited to a bottom gate FeFET, or a double gate FeFET, may be formed in similar manners.

Figure 17:
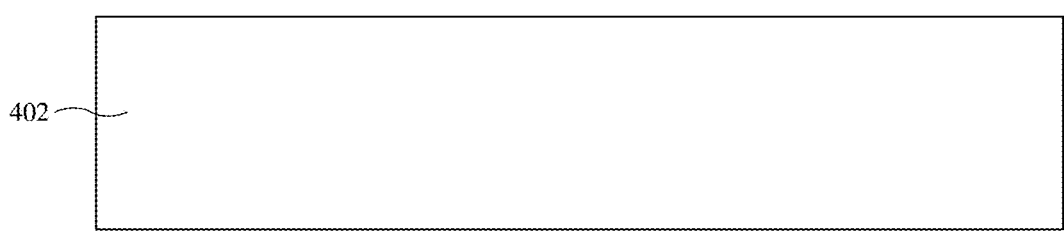
FIGS. 17-25 illustrate a series of cross-sectional views of some embodiments of a method for forming a memory device in which a 1T ferroelectric memory device comprises an inhibition layer.

As illustrated by the cross-sectional view 1700 of FIG. 17, a substrate 402 is provided. The substrate 402 may, for example, be or comprise a silicon substrate, a silicon-on-insulator (SOI) substrate, a polymer substrate, or some other suitable type of semiconductor substrate. In some embodiments, the substrate 402 is as described with regard to FIG. 4.

Figure 18:
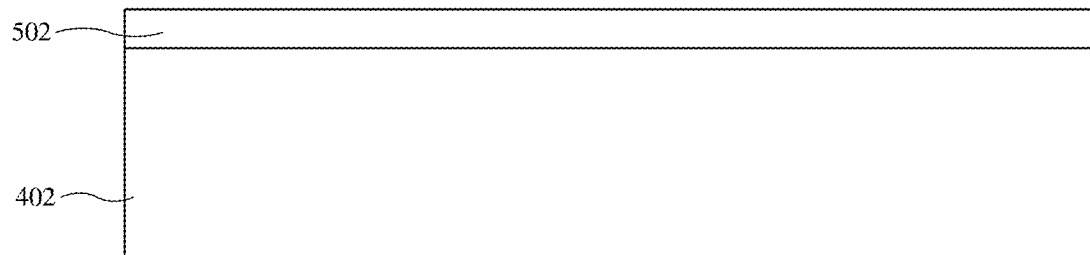

As illustrated by the cross-sectional view 1800 of FIG. 18, a gate dielectric layer 502 is formed over the substrate 402. The gate dielectric layer 502 may be formed by, for example, depositing the gate dielectric layer 502 by CVD, PVD, ALD, some other suitable deposition process, or any combination of the foregoing.

Figure 19:
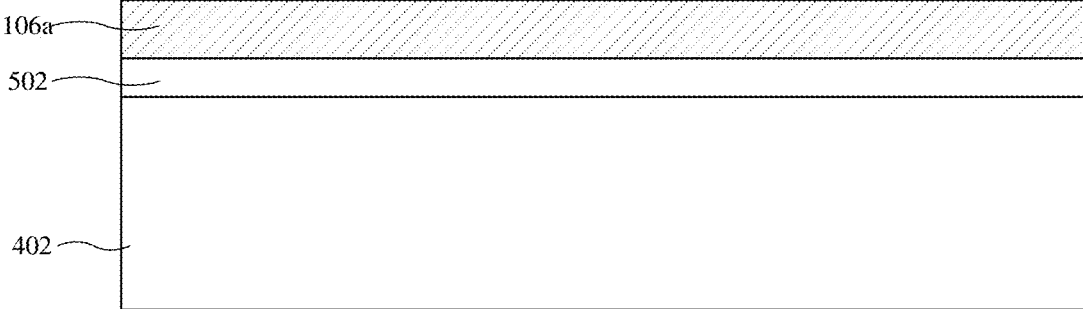

As illustrated by the cross-sectional view 1900 of FIG. 19, a first ferroelectric layer 106a is formed over the gate dielectric layer 502. The first ferroelectric layer 106a may be formed by DC sputtering, PVD, CVD, ALD, some other suitable deposition process, or any combination of the foregoing.

Figure 20:
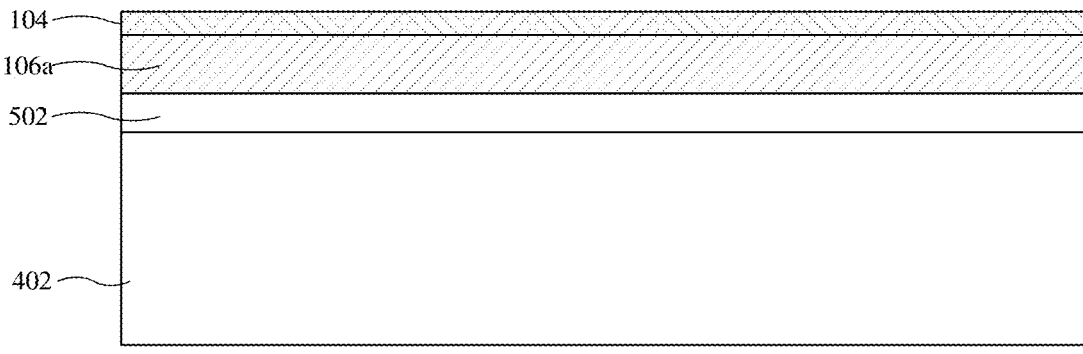

As illustrated by the cross-sectional view 2000 of FIG. 20, an inhibition layer 104 is formed over the first ferroelectric layer 106a. A process for forming the first inhibition layer 104a may be or be comprised of depositing the first inhibition layer 104a by an ALD process by as simple as a few cycles or even one cycle. The first inhibition layer 104a may have a lattice constant at least 5% different from the first and second ferroelectric layers 106a, 106b, such that the first inhibition layer 104a can inhibit continuous grain growth between the first and second ferroelectric layers 106a, 106b. In some embodiments, the first inhibition layer 104a has a thickness $T_r$ approximately or smaller than 1 Å. In some embodiments, the thickness $T_r$ of the first inhibition layer 104a may be less than 0.1 nanometers, about 0.1-0.3 nanometers, about 0.1-1 nanometers, or some other suitable value.

Figure 21:
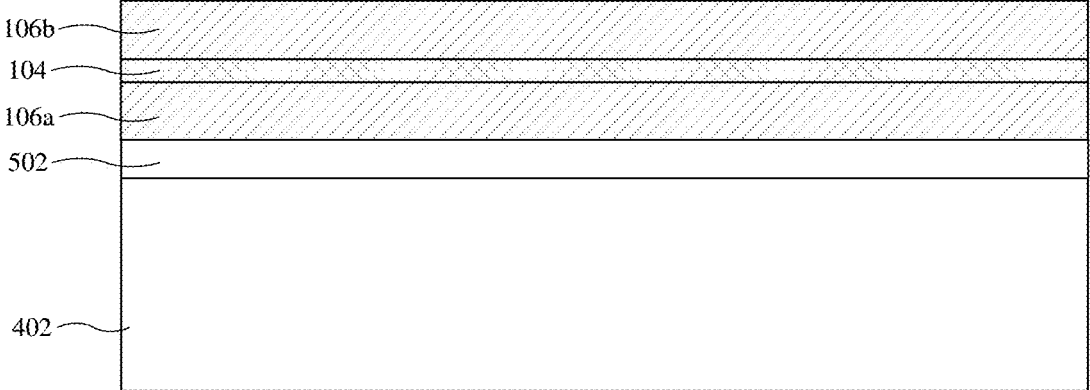

As illustrated by the cross-sectional view 2100 of FIG. 21, a second ferroelectric layer 106b is formed over the inhibition layer 104. A process for forming the second ferroelectric layer 106b may be similar as forming the first ferroelectric layer 106a. In some embodiments, the first and second ferroelectric layers 106a, 106b respectively has a thickness $T_f$ smaller than a first critical thickness, for example, 8 nm or 10 nm. The thickness $T_f$ may be further limited to smaller than 6 nm for more stable and enhanced performance. By limiting the thickness $T_f$ of the first and second ferroelectric layers 106a, 106b under the first critical thickness and inserting the first inhibition layer 104a between the first and second ferroelectric layers 106a, 106b, the ferroelectric structure 102 presents more tetragonal properties as compared to a similar structure absenting the inhibition layers 104 and with a greater thickness.

Accordingly, in some embodiments, the first ferroelectric layer 106a and the second ferroelectric layer 106b have individual thicknesses Tf of about 1-4 nanometers, about 1-6 nanometers, about 1-8 nanometers, about 1-10 nanometers, or some other suitable value. By placing the first inhibition layer 104a between the first and second ferroelectric layers 106a, 106b, the continuous grain growth of the ferroelectric layer is interrupted under the first critical thickness (e.g. approximately 8 nm or 10 nm), and thus results in a tuning of the ferroelectric structure 102 from orthorhombic phase to tetragonal phase, and from FE properties to AFE properties and improve endurance of the ferroelectric structure 102. In some embodiments, the first ferroelectric layer 106a, the second ferroelectric layer 106b, or the whole ferroelectric structure 102 is tetragonal dominant and presents stable AFE properties.

Figure 22:
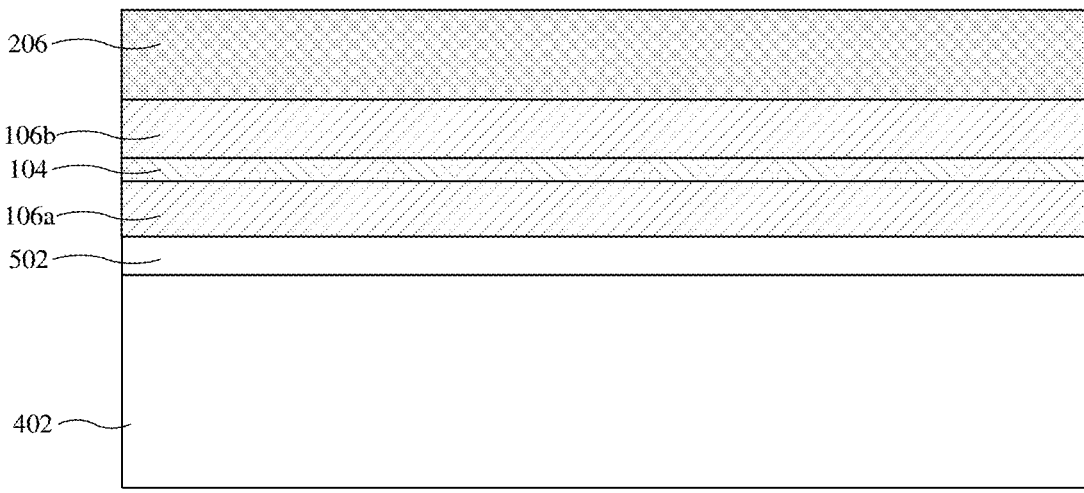

As illustrated by the cross-sectional view 2200 of FIG. 22, a top electrode 206 is formed over the second ferroelectric layer 106b. A process for forming the top electrode 206 may be as described in FIG. 13.

Figure 23:
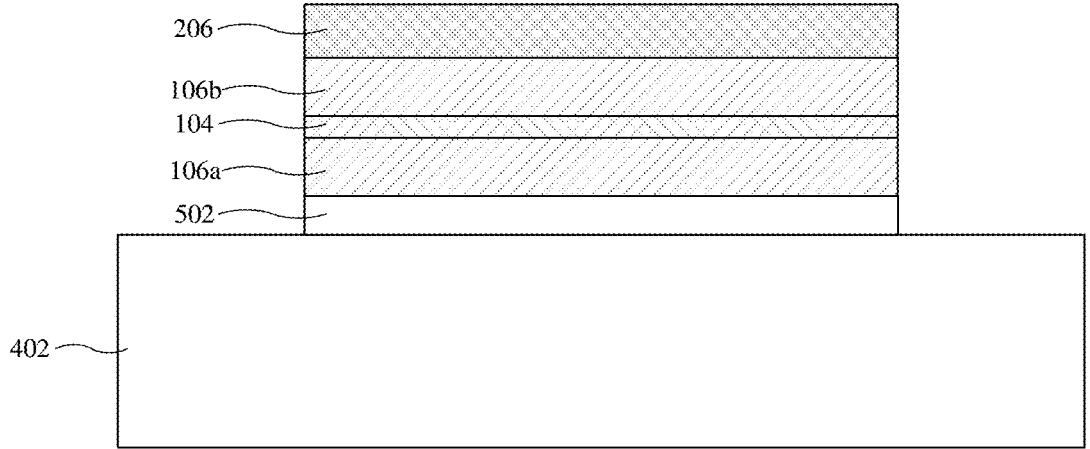

As illustrated by the cross-sectional view 2300 of FIG. 23, the gate dielectric layer 502, the first ferroelectric layer 106a, the inhibition layer 104, the second ferroelectric layer 106b, and the top electrode 206 are patterned to form a columnar gate stack. The patterning may, for example, be performed by a photolithography/etching process and/or by some other suitable process. In some embodiments, the patterning comprises: forming a hard mask (not shown) over the top electrode 206 using a photolithography/etching process; and subsequently etching the gate dielectric layer 502, the first ferroelectric layer 106a, the inhibition layer 104, the second ferroelectric layer 106b, and the top electrode 206 with the hard mask in place.

Figure 24:
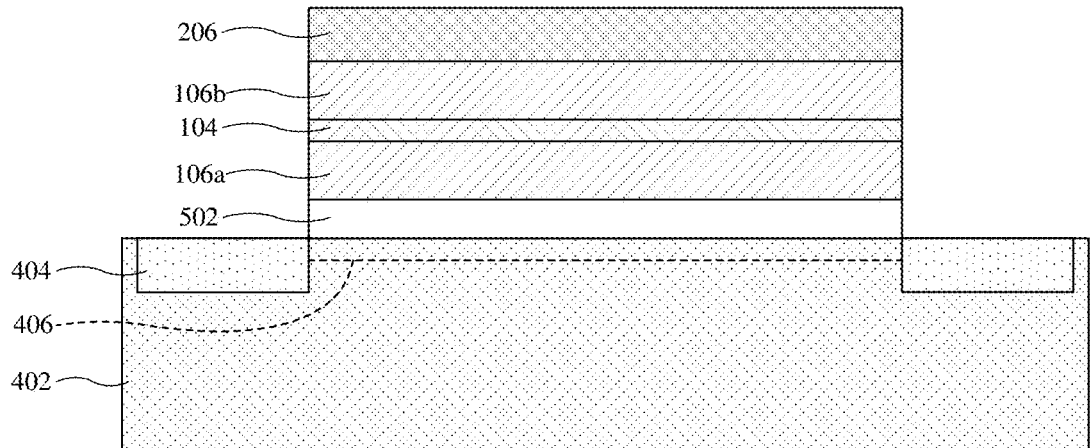

As illustrated by the cross-sectional view 2400 of FIG. 24, the substrate 402 is doped to form a pair of source/drain regions 404 in the substrate 402. The source/drain regions 404 are respectively on opposite sides of the columnar gate stack and demarcate a channel region 406 underlying the columnar gate stack. The doping may, for example, be performed by ion implantation and/or some other suitable doping process.

Figure 25:
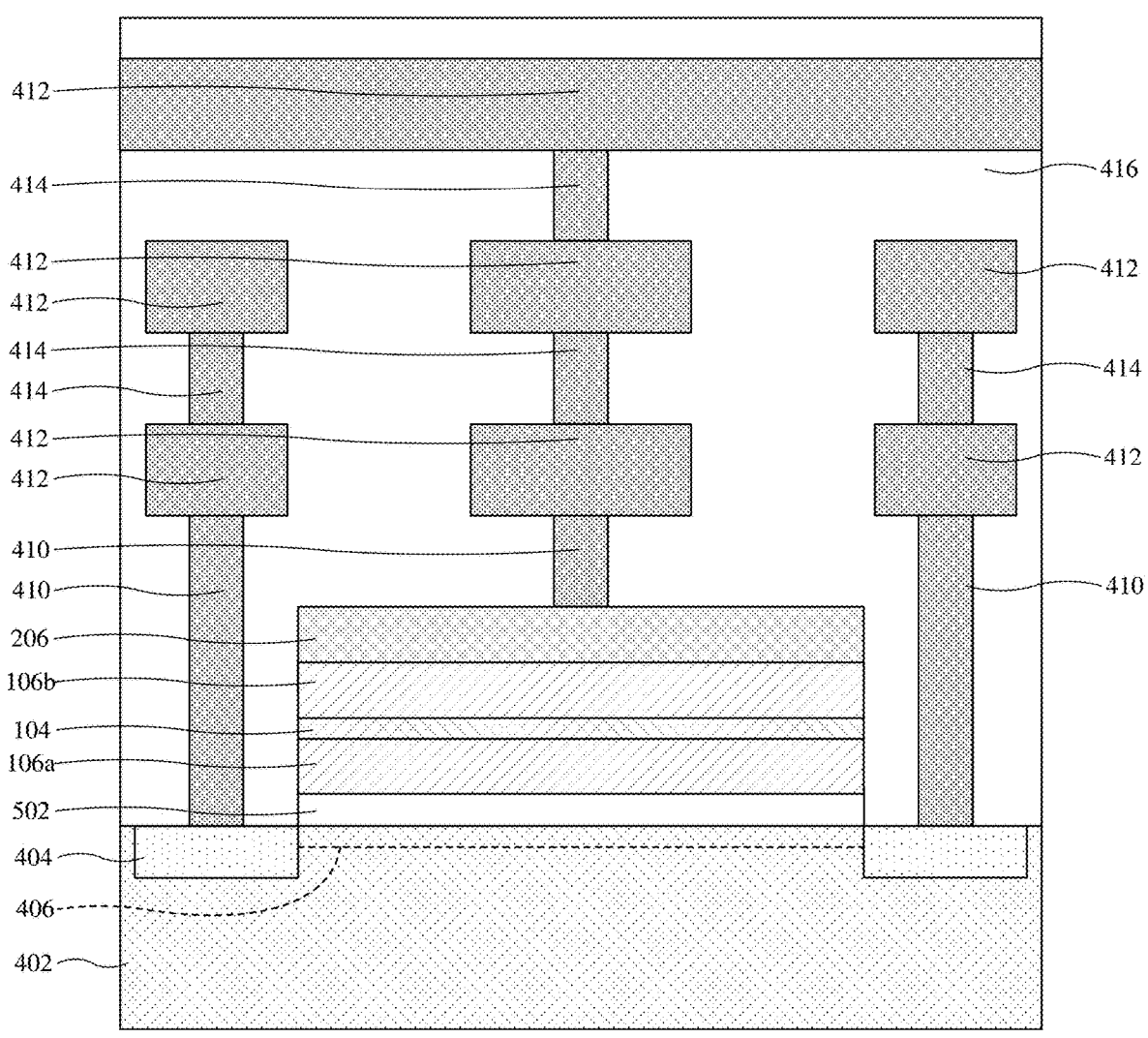

As illustrated by the cross-sectional view 2500 of FIG. 25, an interconnect dielectric layer 416 is formed over the substrate 402. Further, a plurality of contact vias 410 are formed in the interconnect dielectric layer 416 to contact the pair of source/drain regions 404 and the top electrode 206, respectively. In some embodiments, a plurality of wires 412 (e.g., metal lines) and a plurality of interlevel vias 414 are formed in the interconnect dielectric layer 416. The plurality of wires 412, the plurality of interlevel vias 414, and the plurality of contact vias 410 are electrically coupled to define conductive paths. It will be appreciated that any number of conductive wires 412 and/or interlevel vias 414 may be alternately formed over one another in the interconnect dielectric layer 416. In yet further embodiments, the plurality of contact vias 410, the plurality of wires 412, and the plurality of interlevel vias 414 may be referred to as an interconnect structure. In some embodiments, the interconnect structure is as described in FIG. 4.

With respect to FIG. 26, a flowchart illustrating some embodiments of a method for forming a 1T ferroelectric memory device comprising inhibition layers is provided. The method may, for example, correspond to the method of FIGS. 17-25.

While the disclosed flowchart is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2602, a substrate is provided. See, for example, FIG. 17.

At 2604, a gate dielectric layer is formed over the substrate. See, for example, FIG. 18.

At 2606, a first ferroelectric layer is formed over the gate dielectric layer. See, for example, FIG. 19.

At 2608, an inhibition layer is formed over the first ferroelectric layer. See, for example, FIG. 20.

At 2610, a second ferroelectric layer is formed over the inhibition layer. See, for example, FIG. 21.

At 2612, a top electrode is formed over the second ferroelectric layer. See, for example, FIG. 22.

At 2614, the gate dielectric layer, the first ferroelectric layer, the inhibition layer, the second ferroelectric layer, and the top electrode are patterned to define a columnar gate stack. See, for example, FIG. 23.

At 2616, a pair of source/drain regions are formed in the substrate, where the columnar gate stack is laterally between the source/drain regions. See, for example, FIG. 24.

At 2618, an interconnect structure is formed over the substrate. See, for example, FIG. 25.

Accordingly, in some embodiments, the present disclosure relates to a ferroelectric structure. The ferroelectric structure includes a first ferroelectric layer, a second ferroelectric layer overlying the first ferroelectric layer, and a first inhibition layer disposed between the first and second ferroelectric layers and bordering the second ferroelectric layer. The first inhibition layer is a different material than the first and second ferroelectric layers. The ferroelectric structure is tetragonal-phase dominant.

In other embodiments, the present disclosure relates to an integrated circuit (IC). The IC includes a first electrode and a ferroelectric structure vertically stacked with the first electrode. The ferroelectric structure includes a first ferroelectric layer, a second ferroelectric layer overlying the first ferroelectric layer, and a first inhibition layer between and bordering the first and second ferroelectric layers. The first inhibition layer is a different material type than that of the first and second ferroelectric layers. The first ferroelectric layer and the second ferroelectric layer respectively has a thickness less than 8 nm.

In yet other embodiments, the present disclosure relates to a method for forming an IC. The method includes depositing a lower ferroelectric layer of a first material type over a substrate, depositing a first inhibition layer of a second material type different than the first material type overlying the lower ferroelectric layer, and depositing an upper ferroelectric layer directly on the first inhibition layer. A tetragonal-phase dominates the upper ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A ferroelectric structure, comprising:
a first ferroelectric layer;
a second ferroelectric layer overlying the first ferroelectric layer; and
a first inhibition layer disposed between the first and second ferroelectric layers and bordering the second ferroelectric layer, the first inhibition layer being a different material than the first and second ferroelectric layers; and
wherein the ferroelectric structure is tetragonal-phase dominant,
wherein the first ferroelectric layer, having a first thickness, comprises a hafnium zirconium oxide with a first zirconium doping concentration, and the second ferroelectric layer, having a second thickness different from the first thickness, comprises a hafnium zirconium oxide with a second zirconium doping concentration different from the first zirconium doping concentration.

2. The ferroelectric structure of claim 1, wherein the first ferroelectric layer and the second ferroelectric layer respectively have a thickness less than 8 nm.

3. The ferroelectric structure of claim 1, wherein the second ferroelectric layer is hafnium zirconium oxide (HZO) with a doping concentration of Zr less than 70%.

4. The ferroelectric structure of claim 1, wherein the first and second ferroelectric layers are both hafnium (Hf) zirconium (Zr) oxide (HZO) with different doping concentrations of Zr in a range of about 50% to 70%.

5. The ferroelectric structure of claim 1, wherein
the first ferroelectric layer has the hafnium zirconium oxide with a higher zirconium doping concentration, and
the second ferroelectric layer, overlying the first ferroelectric layer, has the hafnium zirconium oxide with a lower zirconium doping concentration and a smaller thickness than the first ferroelectric layer.

6. The ferroelectric structure of claim 1, wherein the first inhibition layer has a thickness less than 1 nm.

7. The ferroelectric structure of claim 1, wherein the first inhibition layer is Alumina ($Al_2O_3$).

8. The ferroelectric structure of claim 1, further comprising a second inhibition layer at a bottom of the first ferroelectric layer, wherein the second inhibition layer is of the same material and thickness as the first inhibition layer.

9. The ferroelectric structure of claim 8, further comprising a third inhibition layer at a top of the second ferroelectric layer, wherein the third inhibition layer is of the same material and thickness as the first inhibition layer.

10. The ferroelectric structure of claim 9, further comprising a third ferroelectric layer disposed directly on the third inhibition layer, wherein the third ferroelectric layer has the same material and thickness as the second ferroelectric layer, which are different than the first ferroelectric layer.

11. An integrated circuit (IC), comprising:
a first electrode; and
a ferroelectric structure vertically stacked with the first electrode, wherein the ferroelectric structure comprises:
a first ferroelectric layer;
a second ferroelectric layer overlying the first ferroelectric layer; and
a first inhibition layer between and bordering the first and second ferroelectric layers, the first inhibition layer being a different material type than that of the first and second ferroelectric layers;
wherein the first ferroelectric layer has a hafnium zirconium oxide with a higher zirconium doping concentration, and the second ferroelectric layer has a hafnium zirconium oxide with a lower zirconium doping concentration and a smaller thickness than the first ferroelectric layer,
wherein the first ferroelectric layer and the second ferroelectric layer respectively have a thickness less than 8 nm.

12. The IC of claim 11, wherein
the first and second ferroelectric layers are both hafnium (Hf) zirconium (Zr) oxide (HZO) with different doping concentrations of Zr less than 70%.

13. The IC of claim 11,
wherein the ferroelectric structure further comprises a second inhibition layer between and bordering the first ferroelectric layer and the first electrode; and
wherein the ferroelectric structure is tetragonal-phase dominant.

14. The IC of claim 11, further comprising a second electrode vertically stacked with the first electrode and the ferroelectric structure, wherein the ferroelectric structure is between and borders the first and second electrodes.

15. The IC of claim 14, further comprising:

a second inhibition layer at a top of the second ferroelectric layer, wherein the second inhibition layer is of the same material and thickness as the first inhibition layer; and a third ferroelectric layer disposed directly on the second inhibition layer.

16. The IC of claim 14, wherein the second electrode directly contacts an additional inhibition layer that is of the same material as the first inhibition layer.

17. An integrated circuit (IC), comprising:

a lower ferroelectric layer with a first material type disposed over a substrate;

a first inhibition layer overlying the lower ferroelectric layer and comprising a second material type different than the first material type; and an upper ferroelectric layer disposed directly on the first inhibition layer;

a second inhibition layer at a bottom of the lower ferroelectric layer, wherein the second inhibition layer is of the same material and thickness as the first inhibition layer;

a third inhibition layer at a top of the upper ferroelectric layer, wherein the third inhibition layer is of the same material and thickness as the first inhibition layer; and an additional ferroelectric layer disposed directly on the third inhibition layer, wherein the additional ferroelectric layer has the same material and thickness as the upper ferroelectric layer, which are different from material and thickness of the lower ferroelectric layer, wherein a tetragonal-phase dominates the upper ferroelectric layer.

18. The IC of claim 17, wherein the first inhibition layer has a thickness less than 1 nm.

19. The IC of claim 17, wherein the upper ferroelectric layer and the lower ferroelectric layer are of the same elements with different ratios.

20. The IC of claim 17, further comprising:

a second inhibition layer disposed at a top of the upper ferroelectric layer, wherein the second inhibition layer is of the same material and thickness as the first inhibition layer, wherein the second inhibition layer is configured to stabilize a crystalline lattice of the upper ferroelectric layer to prevent thermodynamic instability of the tetragonal-phase.

\*　\*　\*　\*　\*